(12) United States Patent
Watanabe

(10) Patent No.: US 12,523,940 B2
(45) Date of Patent: Jan. 13, 2026

(54) EXPOSURE APPARATUS, MEASURING DEVICE, MEASURING METHOD, AND DEVICE MANUFACTURING METHOD

(71) Applicant: NIKON CORPORATION, Tokyo (JP)

(72) Inventor: Yoji Watanabe, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 116 days.

(21) Appl. No.: 18/021,401

(22) PCT Filed: Aug. 18, 2020

(86) PCT No.: PCT/JP2020/031161
§ 371 (c)(1),
(2) Date: Mar. 30, 2023

(87) PCT Pub. No.: WO2022/038683
PCT Pub. Date: Feb. 24, 2022

(65) Prior Publication Data
US 2024/0027917 A1 Jan. 25, 2024

(51) Int. Cl.
*G03F 7/20* (2006.01)
*G01B 11/00* (2006.01)
*G03F 7/00* (2006.01)

(52) U.S. Cl.
CPC ........ *G03F 7/70591* (2013.01); *G01B 11/002* (2013.01)

(58) Field of Classification Search
CPC .............. G03F 7/70591; G03F 7/7085; G03F 7/70291; G01B 11/002
See application file for complete search history.

(56) References Cited

U.S. PATENT DOCUMENTS

2004/0252180 A1\* 12/2004 Takada ................. H04N 1/1903
347/239
2005/0168790 A1 8/2005 Latypov et al.
(Continued)

FOREIGN PATENT DOCUMENTS

CN 1573414 A 2/2005
CN 101910817 A 12/2010
(Continued)

OTHER PUBLICATIONS

Nov. 10, 2020 Search Report issued in International Application No. PCT/JP2020/031161.
(Continued)

*Primary Examiner* — Mesfin T Asfaw
(74) *Attorney, Agent, or Firm* — Oliff PLC

(57) ABSTRACT

An exposure apparatus includes: an exposure illumination optical system illuminating a spatial light modulator which has a plurality of spatial light modulation elements having a reflecting surface disposed on a disposition plane; a projection optical system projecting light from the spatial light modulator to an exposed substrate; a first detection unit detecting light from the reflecting surface; a second detection unit which is a detection unit detecting light from the reflecting surface and has a detection field of view larger than that of the first detection unit; and a position changing mechanism changing a positional relationship among the first detection unit, the second detection unit, and the spatial light modulator to either a first positional relationship in which the spatial light modulator faces the first detection unit and a second positional relationship in which the spatial light modulator faces the second detection unit.

17 Claims, 9 Drawing Sheets

(56) References Cited

U.S. PATENT DOCUMENTS

| | | |
|---|---|---|
| 2009/0244506 A1 | 10/2009 | Visser et al. |
| 2011/0069305 A1 | 3/2011 | Tanitsu et al. |
| 2014/0293254 A1 | 10/2014 | Komatsuda |
| 2014/0320835 A1 | 10/2014 | Fujiwara |
| 2015/0077732 A1 | 3/2015 | Owa et al. |
| 2015/0146183 A1 | 5/2015 | Deguenther et al. |
| 2018/0210346 A1 | 7/2018 | Laidig et al. |
| 2019/0285988 A1 | 9/2019 | Osaka |

FOREIGN PATENT DOCUMENTS

| | | |
|---|---|---|
| JP | 2005-223328 A | 8/2005 |
| JP | 2009-163242 A | 7/2009 |
| JP | 2015-111672 A | 6/2015 |
| JP | 2018-155851 A | 10/2018 |
| JP | 2020-504338 A | 2/2020 |
| WO | 2013/031901 A1 | 3/2013 |
| WO | 2013/039240 A1 | 3/2013 |
| WO | 2013/108560 A1 | 7/2013 |
| WO | 2019/146448 A1 | 8/2019 |

OTHER PUBLICATIONS

Nov. 10, 2020 Written Opinion of the International Searching Authority issued in International Application No. PCT/JP2020/031161.

Mar. 31, 2025 Office Action issued in Chinese Patent Application No. 202080105053.3.

Apr. 15, 2025 Office Action issued in Japanese Patent Application No. 2024-130241.

Oct. 21, 2025 Office Action issued in Japanese Patent Application No. 2024-130241.

* cited by examiner (a)

(b)

EXPOSURE APPARATUS, MEASURING DEVICE, MEASURING METHOD, AND DEVICE MANUFACTURING METHOD

TECHNICAL FIELD

The present invention relates to an exposure apparatus, a measuring device, a measuring method, and a device manufacturing method.

BACKGROUND

As a member for forming a pattern to be exposed and transferred, an exposure apparatus using a spatial light modulator such as a digital mirror device in which a reflectance of irradiation light in a predetermined direction is variable has been proposed (Patent Document 1).

RELATED ART DOCUMENTS

Patent Documents

Patent Document 1

United States Patent Application, Publication No. 2019/0285988

SUMMARY OF INVENTION

According to a first aspect, an exposure apparatus includes: an exposure illumination optical system illuminating a spatial light modulator which has a plurality of spatial light modulation elements having a reflecting surface disposed on a disposition plane; a projection optical system projecting light from the spatial light modulator to an exposed substrate; a first detection unit including a first detection optical system and configured to detect light from the reflecting surface; a second detection unit which is a detection unit including a second detection optical system and detecting light from the reflecting surface, and has a detection field of view larger than that of the first detection unit; and a position changing mechanism changing a positional relationship among the first detection unit, the second detection unit, and the spatial light modulator to either a first positional relationship in which the spatial light modulator faces the first detection unit and a second positional relationship in which the spatial light modulator faces the second detection unit.

According to a second aspect, a measuring device, which is a measuring device measuring a spatial light modulator including a plurality of spatial light modulation elements each having a reflecting surface, includes: an illumination system irradiating a disposition plane on which each reflecting surface of the plurality of spatial light modulation elements is disposed with light; a detection optical system forming an image of the disposition plane based on light from a plurality of reflecting surfaces; an imaging unit detecting an image of the disposition plane formed by the detection optical system; and a calculation unit calculating positional information of the reflecting surface of the spatial light modulation element in a normal direction of the disposition plane or positional information on a rotation angle of the reflecting surface of the spatial light modulation element from the disposition plane based on an amount of detection light which is an amount of light of the image detected by the imaging unit.

According to a third aspect, a measuring device includes: a first detection unit detecting light from a reflecting surface of a spatial light modulator which has a plurality of spatial light modulation elements having the reflecting surface disposed on a disposition plane; a second detection unit which is a detection unit detecting light from the reflecting surface and has a detection field of view larger than that of the first detection unit; and a position changing mechanism changing a positional relationship among the first detection unit, the second detection unit, and the spatial light modulator to either a first positional relationship in which the spatial light modulator faces the first detection unit and a second positional relationship in which the spatial light modulator faces the second detection unit.

According to a fourth aspect, a measuring method, which is a measuring method using a spatial light modulator including a plurality of spatial light modulation elements each having a reflecting surface, includes: setting the reflecting surface of the spatial light modulation element of a first group and the reflecting surface of the spatial light modulation element of a second group at different positions in a normal direction of a disposition plane for the spatial light modulation element of the first group and the spatial light modulation element of the second group which are alternately disposed in a first region in the disposition plane on which each reflecting surface of the plurality of spatial light modulation elements is disposed; measuring distance information in the normal direction between at least one of the reflecting surfaces of the first group and at least one of the reflecting surfaces of the second group by a first detection unit; measuring an amount of reference light, which is an amount of light of an image of a portion corresponding to the first region, by an imaging-type second detection unit; calculating a correspondence relationship between a distance in the normal direction between the reflecting surface of the first group and the reflecting surface of the second group, and an amount of light of the image based on the measured distance information and the amount of reference light; setting the reflecting surface of the spatial light modulation element of a third group and the reflecting surface of the spatial light modulation element of a fourth group, which are alternately disposed in a second region different from the first region in the disposition plane, at different positions in a normal direction of the disposition plane; measuring an amount of detection light, which is an amount of light of an image of a portion corresponding to the second region, by the second detection unit; and calculating distance information in the normal direction between the reflecting surface of the spatial light modulation element of the third group and the reflecting surface of the spatial light modulation element of the fourth group in the second region based on the amount of detection light and the correspondence relationship.

According to a fifth aspect, an exposure apparatus includes: an exposure illumination optical system illuminating a spatial light modulator which has a plurality of spatial light modulation elements having a reflecting surface disposed on a disposition plane; a projection optical system projecting light from the spatial light modulator to an exposed substrate; and a measuring device according to the second aspect or the third aspect.

According to a sixth aspect, a device manufacturing method includes: forming a resist on a surface of a substrate; exposing an exposure pattern using the exposure apparatus according to the first aspect or the fifth aspect; and forming a circuit pattern based on the exposure pattern.

DESCRIPTION OF EMBODIMENTS

Measuring Device of First Embodiment

Figure 1:
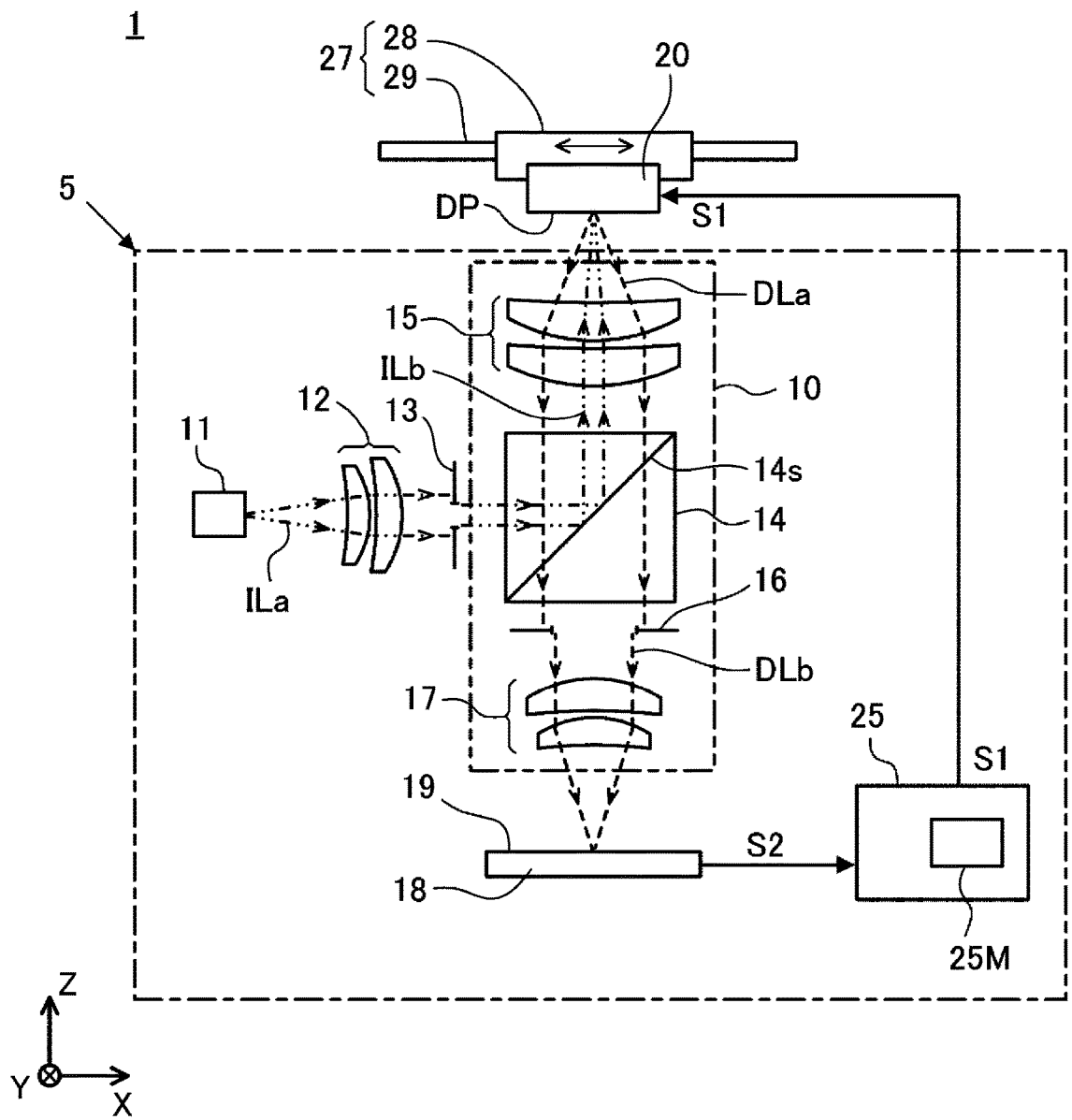
FIG. 1 is a view schematically illustrating a configuration of a measuring device according to a first embodiment.

FIG. 1 is a view schematically illustrating a configuration of a measuring device 1 according to a first embodiment. The measuring device 1 of the first embodiment is a device for measuring an operation state of a spatial light modulator 20 and includes a detection unit 5 illustrated by being surrounded by a dashed-dotted line in FIG. 1.

An X direction, a Y direction, and a Z direction illustrated by arrows in FIG. 1 and figures referred to below are directions perpendicular to each other, and the X direction, the Y direction, and the Z direction each indicate the same directions in the figures. Hereinafter, directions indicated by the arrows will be each referred to as a +X direction, +Y direction, and +Z direction. Also, a position in the X direction is referred to as an X position, a position in the Y direction is referred to as a Y position, and a position in the Z direction is referred to as a Z position.

The spatial light modulator 20 is held by a holding part 28, and the holding part 28 is movable on a guide part 29 in the X and Y directions. Therefore, the spatial light modulator 20 is held to be movable relative to the detection unit 5 in the X and Y directions. Together or individually, the holding part 28 and the guide part 29 are also referred to as a moving mechanism 27.

Figure 2:
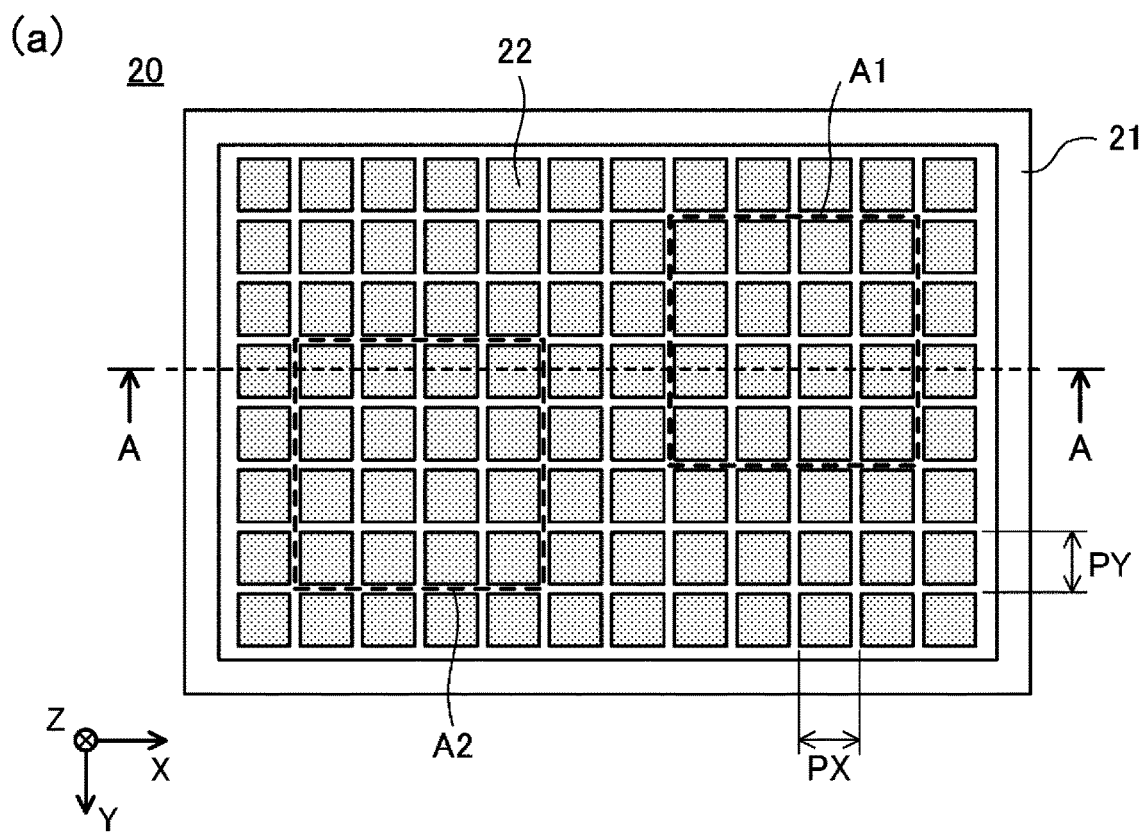
FIG. 2 is a view schematically illustrating a configuration of a spatial light modulator.
Figure 2:
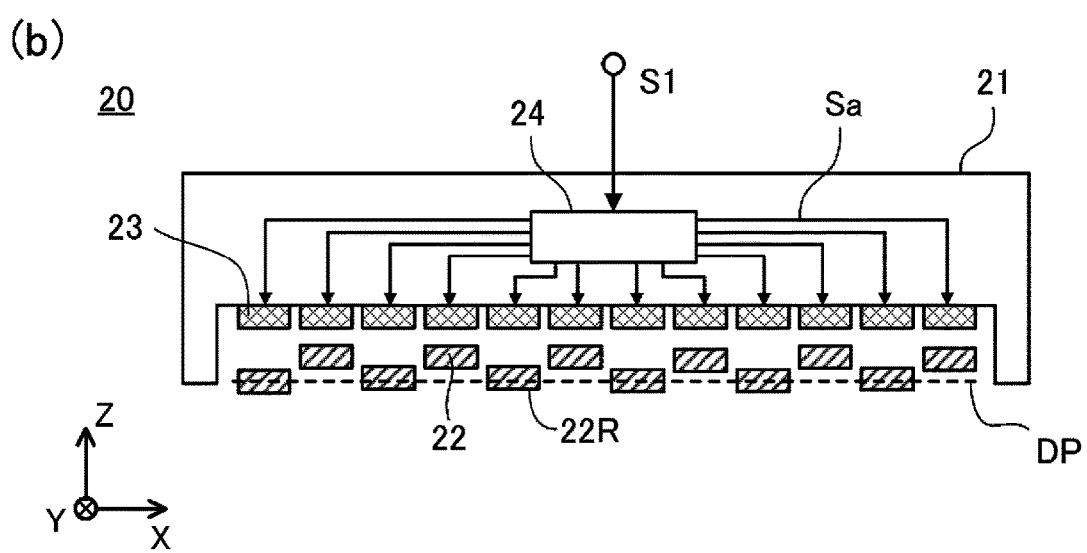

FIG. 2 is a view schematically illustrating a configuration of the spatial light modulator 20 which is an object to be measured by the measuring device 1. FIG. 2(a) illustrates a view of the spatial light modulator 20 from a −Z direction, and FIG. 2(b) illustrates an XZ cross section of the spatial light modulator 20 along an AA section line in FIG. 2(a).

On a surface of the spatial light modulator 20 on a −Z side, a plurality of spatial light modulation elements 22 having reflecting surfaces 22R at an end portion on the −Z side are disposed. The plurality of spatial light modulation elements 22 are disposed so that the reflecting surfaces 22R are substantially coincident with a disposition plane DP which is one XY plane in the vicinity of an end portion of the spatial light modulator 20 on the −Z side. As an example, the plurality of spatial light modulation elements 22 are disposed in the X and Y directions, in which a disposition period of the spatial light modulation elements 22 in the X direction is PX and a disposition period thereof in the Y direction is PY.

Each of the spatial light modulation elements 22 is held by a housing 21 of the spatial light modulator 20 via a holding member (not illustrated) having elasticity. A counter electrode 23 is disposed at a portion of the housing 21 facing the +Z side of each spatial light modulation element 22. If a predetermined voltage is applied as a control signal Sa from a modulation control unit 24 to each counter electrode 23, each spatial light modulation element 22 is translated in the Z direction and is set to the Z position corresponding to a voltage of the control signal Sa applied to the facing counter electrode 23. The modulation control unit 24 sends the control signal Sa to each counter electrode 23 on the basis of a control signal S1 supplied from the outside.

As described above, since the disposition plane DP is one of the XY planes, the Z direction is a normal direction with respect to the disposition plane DP.

A first region A1 and a second region A2 indicated by the broken line in FIG. 2(a) will be described later.

Figure 3:
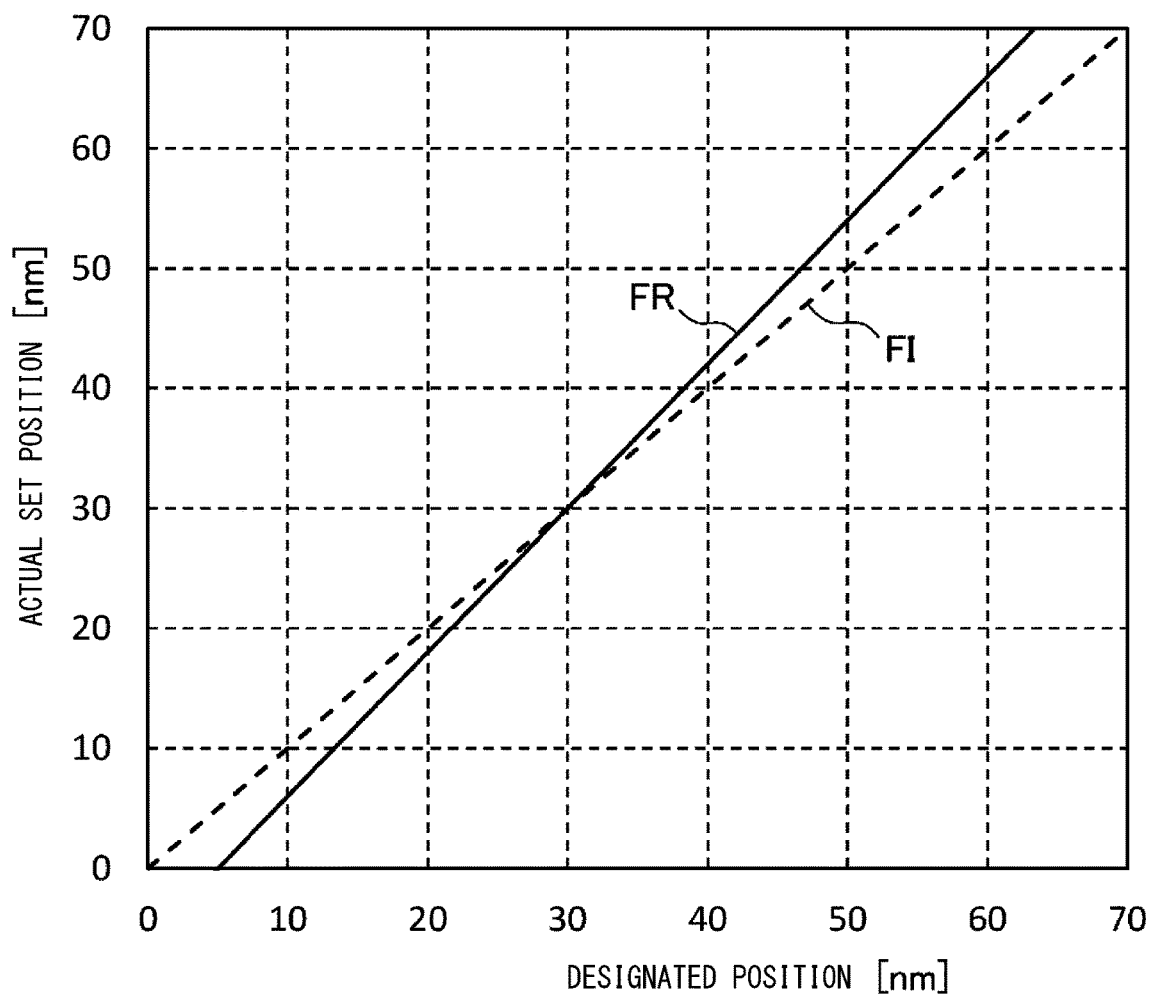
FIG. 3 is a diagram showing an example of a relationship between a designated position transmitted to a spatial light modulation element and an actual set position at which the spatial light modulation element is actually set.

FIG. 3 is a diagram showing an example of a position set relationship FR, which is a relationship between a designated position (horizontal axis) which is the Z position of the reflecting surfaces 22R designated by the control signal S1 and the control signal Sa and an actual set position (vertical axis) which is the Z position in which the reflecting surfaces 22R are actually set. The actual set position is a relative position in the Z direction from the disposition plane DP, and if the actual set position is 0 [nm], the reflecting surfaces 22R are assumed to be coincident with the disposition plane DP.

The position set relationship FR deviates from an ideal proportional relationship FI due to manufacturing errors, thermal expansion, electrostatic charge, and the like of each member constituting the spatial light modulator 20. Even in one spatial light modulator 20, the spatial light modulation elements 22 at different positions in the disposition plane DP may have different position set relationships FR.

A configuration of the detection unit 5 of the measuring device 1 will be described with reference to FIG. 1. The detection unit 5 includes a detection light source 11, a light-transmitting lens 12, an illumination aperture stop 13, a branching element 14, an objective lens 15, a detection aperture stop 16, an image-forming lens 17, an imaging unit 18, and a control unit 25.

Of these, the light-transmitting lens 12, the illumination aperture stop 13, the branching element 14, and the objective lens 15 constitute an illumination system that irradiates the disposition plane DP of the spatial light modulation elements 22 constituting the spatial light modulator 20 with light.

Also, the objective lens 15, the branching element 14, the detection aperture stop 16, and the image-forming lens 17 included in a portion surrounded by a double-dotted-dashed line constitute a detection optical system 10 that forms an image of the disposition plane DP on an imaging surface 19 of the imaging unit 18 such as a solid-state imaging device.

Illumination light ILa emitted from the detection light source 11 is substantially collimated by the light-transmitting lens 12, and a diameter thereof is restricted by the illumination aperture stop 13 to become illumination light ILb. Then, the illumination light ILb is incident on the branching element 14 such as a beam splitter, reflected by a branching surface 14s of the branching element 14, and then focused by the objective lens 15. Then, the focused illumination light ILb is applied to the disposition plane DP of the spatial light modulator 20 as an illumination light flux having a numerical aperture (illumination NA) corresponding to an aperture diameter of the illumination aperture stop 13.

The illumination light ILb is reflected by the plurality of reflecting surfaces 22R (see FIG. 2) disposed in the vicinity of the disposition plane DP, and a part thereof becomes detection light DLa and is incident on the objective lens 15. The detection light DLa is then incident on the branching element 14 to pass through the branching surface 14s of the branching element 14, and a diameter thereof is restricted by the detection aperture stop 16 and becomes detection light DLb.

The detection light DLb is focused by the image-forming lens 17 and is incident on the imaging surface 19 of the imaging unit 18 to form an image of the disposition plane DP on the imaging surface 19. The image of the disposition plane DP is detected by the imaging unit 18, that is, photoelectrically converted into an electrical signal and transmitted to the control unit 25 as an image signal S2.

An amount of light in each part of the image of the disposition plane DP detected by imaging pixels constituting the imaging unit 18 is hereinafter also referred to as "amount of detection light".

The detection light source 11 may, as an example, be a semiconductor laser or an LED having a relatively narrow emission wavelength range. The light-transmitting lens 12, the objective lens 15, and the image-forming lens 17 are not limited to the configuration including the illustrated number (two) of lenses and may include any number of lenses, and all of them may include a reflection optical system. The branching element 14 is not limited to the beam splitter described above, and may be a half mirror made of flat glass or the like.

The control unit 25 sends the control signal S1 to the spatial light modulator 20 and controls so that each spatial light modulation element 22 of the spatial light modulator 20 is set at a predetermined Z position during measurement. The control unit calculates positional information of the spatial light modulator 20 on the basis of the image signal S2. Therefore, the control unit 25 can also be said to be a calculation unit.

Hereinafter, a principle of measurement of the spatial light modulator 20 based on the image signal S2 will be described with reference to FIGS. 4 and 5.

Figure 4:
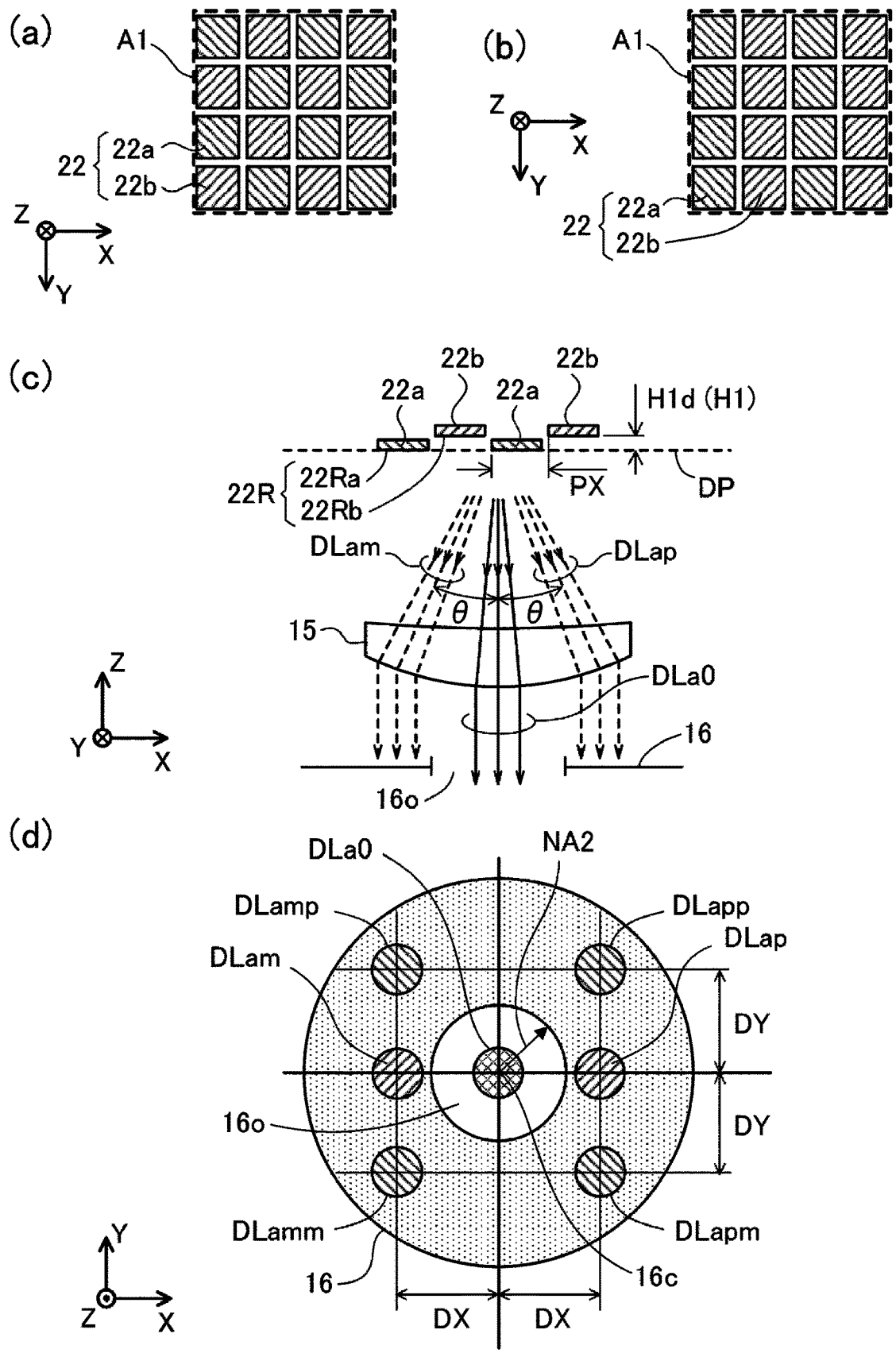
FIG. 4 is a view schematically explaining a principle of modulating an amount of light of specularly reflected light due to the spatial light modulator.

FIG. 4 is a view schematically explaining a principle of modulating an amount of light of specularly reflected light DLa0 due to the spatial light modulator 20. FIGS. 4(a) and 4(b) are views from the −Z direction illustrating examples of operating states of the plurality of spatial light modulation elements 22 disposed in the first region A1 of the spatial light modulator 20 illustrated in FIG. 2(a). Further, the first region A1 may be an arbitrary region on the disposition plane DP of the spatial light modulator 20. Also, the number of the spatial light modulation elements 22 included in the first region A1 is not limited to 4×4 illustrated in FIGS. 2 and 4, and may be any other number.

FIG. 4(c) is a cross-sectional view of the spatial light modulation elements 22 in the first region A1 in the operating state illustrated in FIG. 4(b) and the objective lens 15 illustrated in FIG. 1 from the +Y direction. In FIG. 4(c), illustration of the illumination light ILb (see FIG. 1) applied to the spatial light modulator 20 from the −Z direction is omitted to avoid the drawing becoming complicated.

In FIGS. 4(a) to 4(c), of the spatial light modulation elements 22, elements whose reflecting surfaces 22R are disposed to be substantially coincident with the disposition plane DP are called spatial light modulation elements 22a of a first group. Then, of the spatial light modulation elements 22, elements whose reflecting surfaces 22R are disposed away from the disposition plane DP in the +Z direction are called spatial light modulation elements 22b of a second group.

The reflecting surfaces 22R of the spatial light modulation elements 22a of the first group are denoted by a reference sign of 22Ra, and the reflecting surfaces 22R of the spatial light modulation elements 22b of the second group are denoted by a reference sign of 22Rb. Also, the spatial light modulation element 22a of the first group is marked with hatched lines extending from the upper left to the lower right, and the spatial light modulation element 22b of the second group is marked with hatched lines extending from the lower left to the upper right.

The reflecting surfaces 22Ra of the spatial light modulation elements 22a of the first group are set so that the designated position is 0 (on the disposition plane DP) according to the control signal S1 from the control unit 25 and the control signal Sa from the modulation control unit 24. The reflecting surfaces 22Rb of the spatial light modulation elements 22b of the second group are set so that the designated positions are positioned apart from the disposition plane DP by a designated position difference H1d in the +Z direction according to the control signal S1 from the control unit 25 and the control signal Sa from the modulation control unit 24.

Further, actual set values for the reflecting surfaces 22Ra of the spatial light modulation elements 22a of the first group and the reflecting surfaces 22Rb of the spatial light modulation elements 22b of the second group are close to their designated positions, but they do not necessarily have to be coincident with each other as described above.

A difference between the Z positions of the actual set values of the reflecting surfaces 22Ra of the spatial light modulation elements 22a of the first group and the reflecting surfaces 22Rb of the spatial light modulation elements 22b of the second group is called a position difference H1. The position difference H1 also does not necessarily have to be coincident with the designated position difference H1d described above.

Further, in FIG. 3(c), the position difference H1 and the designated position difference H1d described above represent a length of the same portion because a difference in length therebetween is slight compared to a scale of the drawing.

In FIGS. 4(a) to 4(c), the plurality of spatial light modulation elements 22a of the first group and the plurality of spatial light modulation elements 22b of the second group having the position difference H1 from each other in disposition in the Z direction are alternately disposed on the basis of the control signal S1 from the control unit 25. Here, "alternately disposed" means that the spatial light modulation elements 22a of the first group and the spatial light modulation elements 22b of the second group are disposed to alternate with each each other in the plurality of spatial light modulation elements 22 disposed in a predetermined direction in the XY plane.

FIG. 4(a) illustrates an operating state in which the spatial light modulation elements 22a of the first group and the spatial light modulation elements 22b of the second group are alternately disposed in two directions of the X direction and the Y direction, in other words, disposed in a checkerboard pattern (checkered flag pattern).

FIG. 4(b) illustrates an operating state in which the spatial light modulation elements 22a of the first group and the spatial light modulation elements 22b of the second group are alternately disposed in the X direction, and either the spatial light modulation elements 22a of the first group or the spatial light modulation elements 22b of the second group are continuously disposed in the Y direction.

If the reflecting surface 22R of each of the spatial light modulation elements 22 is irradiated with the illumination light ILb (see FIG. 1) from the substantially −Z direction, a phase difference according to a difference in actual set position which is the Z position of each reflecting surface 22R, that is, the position difference H1, is added to reflected light due to the reflecting surfaces 22Ra and 22Rb. Then, the reflected light is separated into specularly reflected light and a plurality of diffracted lights to be described later according to the phase difference, the disposition period PX of the reflecting surfaces 22R in the X direction, and the disposition period PY of the reflecting surfaces 22R in the Y direction (see FIG. 1) to be emitted from the disposition plane DP at emission angles (diffraction angles) different from each other.

As described above, since FIG. 4(c) is a view illustrating the reflected light from the spatial light modulation elements 22 of the first region A1 in the operating state illustrated in FIG. 4(b), the reflected light is separated into the specularly reflected light DLa0 and diffracted light such as +1st order diffracted light DLap and −1st order diffracted light DLam in the X direction.

The specularly reflected light DLa0 is emitted in a direction (—Z direction) perpendicular to the disposition plane DP. Diffraction angles θ of the +1st order diffracted light DLap and the −1st order diffracted light DLam will be described later.

FIG. 4(d) is a view illustrating positions of the specularly reflected light DLa0, the +1st order diffracted light DLap, the −1st order diffracted light DLam, and the like in the detection aperture stop 16. An aperture 16o having a radius corresponding to a numerical aperture NA2 of the detection optical system 10 on the spatial light modulator side is provided in the detection aperture stop 16 with a center 16c thereof as a center, and an outer side of the aperture 16o serves as a shielding part that shields light.

Distances DX and DY illustrated in FIG. 4(d) will be described later.

FIG. 4(d) also illustrates diffracted lights generated from the spatial light modulation elements 22 in which the spatial light modulation elements 22a of the first group and the spatial light modulation elements 22b of the second group with different Z positions illustrated in FIG. 4(a) are disposed in a checkerboard pattern. In terms of (X-side order, Y-side order), (+1st order, +1st order) diffracted light DLapp, (+1st order, −1st order) diffracted light DLapm, (−1st order, +1st order) diffracted light DLamp, and (−1st order, −1st order) diffracted light DLamm are generated from the spatial light modulation elements 22 illustrated in FIG. 4(a). Also, the specularly reflected light DLa0 is also generated.

However, in any case, the 1st order diffracted lights (DLap, DLam, DLapp, DLapm, DLamp, and DLamm) from the spatial light modulator 20 are shielded by the detection aperture stop 16 and therefore do not reach the imaging unit 18.

On the other hand, the specularly reflected light DLa0 from the spatial light modulator 20 passes through the aperture 16o of the detection aperture stop 16, passes through the image-forming lens 17, and reaches the imaging unit 18. Then, an image of the disposition plane DP is formed on the imaging surface 19 of the imaging unit 18. Therefore, an amount of light of the specularly reflected light DLa0 from each region such as the first region A1 on the disposition plane DP is detected as an amount of detection light, which is an amount of light of the image of each region on the disposition plane DP, by each imaging pixel included in the imaging unit 18.

The amount of light (intensity) of the specularly reflected light DLa0 when the disposition plane DP is irradiated with illumination light of a predetermined wavelength at a predetermined amount of light (intensity) is determined according to the position difference H1, which is a difference in actual set position between the spatial light modulation element 22a of the first group and the spatial light modulation element 22b of the second group.

Figure 5:
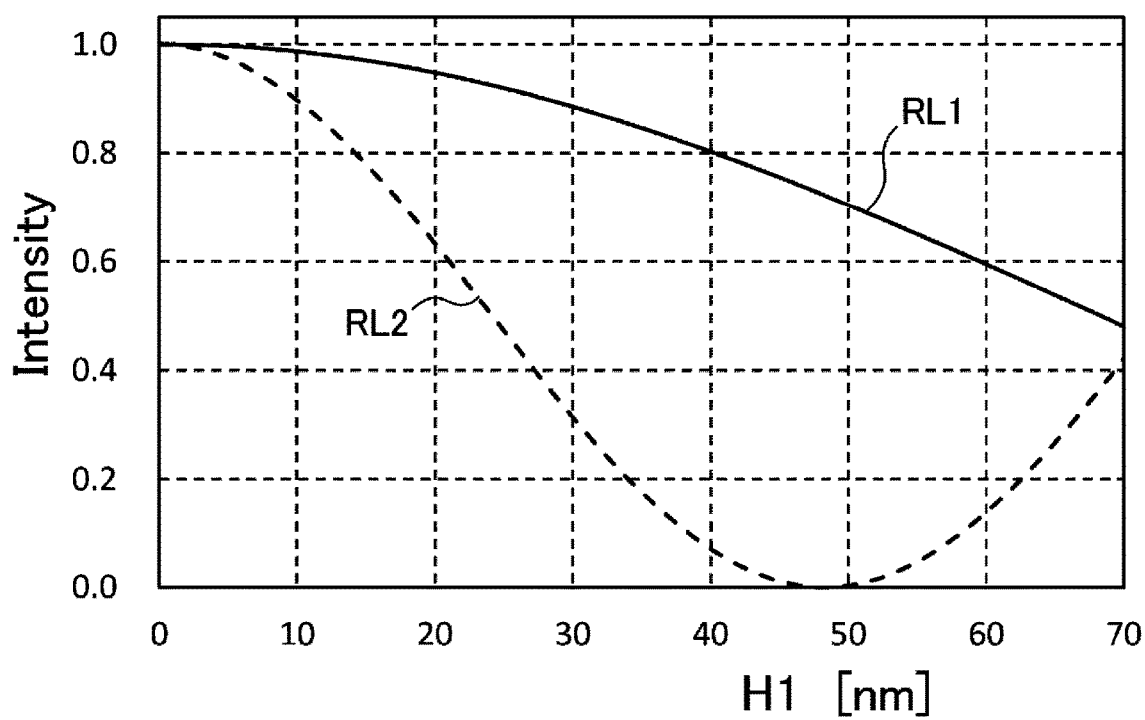
FIG. 5 is a diagram showing an example of a relationship between an amount of specularly reflected light due to the spatial light modulator and a height difference of reflecting surfaces between two spatial light modulation element groups alternately disposed in the spatial light modulator.

FIG. 5 is a diagram showing correspondence relationships RL1 and RL2 between the position difference H1 (horizontal axis) between the spatial light modulation element 22a of the first group and the spatial light modulation element 22b of the second group, and the intensity (vertical axis) of the specularly reflected light DLa0 due to the spatial light modulator 20.

In FIG. 5, a scale of the horizontal axis is [nm], and a scale of the vertical axis is set so that the intensity (intensity) of the specularly reflected light DLa0 is 1 when the position difference H1 is 0 [nm].

The correspondence relationship RL1 illustrated by the solid line indicates, as an example, a correspondence relationship when a wavelength of the specularly reflected light DLa0 is 546 [nm], and the correspondence relationship RL2 illustrated by the broken line indicates, as another example, a correspondence relationship when a wavelength of the specularly reflected light DLa0 is 193 [nm].

The correspondence relationship RL1 is a relationship approximately represented by the following expression (1) with respect to the position difference H1 when the wavelength (546 [nm]) of the specularly reflected light DLa0 is λ.

$$RL1 = \{1 + \cos(4\pi \times <H1/\lambda)\}/2 \qquad (1)$$

The correspondence relationship RL2 is similar to the correspondence relationship RL1.

The intensity of the specularly reflected light DLa0 monotonously decreases as the position difference H1 increases in a range of the position difference H1 from 0 [nm] to ¼ of each wavelength. Therefore, the position difference H1 between the spatial light modulation element 22a of the first group and the spatial light modulation element 22b of the second group in a region such as the first region A1 can be calculated on the basis of the correspondence relationship RL1 (RL2) from the intensity of the specularly reflected light DLa0, that is, the amount of detection light of an image of the region such as the first region A1.

The control unit 25 calculates the position difference H1 between the spatial light modulation element 22a of the first group and the spatial light modulation element 22b of the second group in a region such as the first region A1 of the spatial light modulator 20 on the basis of the image signal S2 detected by the imaging unit 18 and the correspondence relationship RL1 (or the correspondence relationship RL2) described above. The control unit 25 includes a storage unit 25M such as a solid-state memory or a magnetic memory that stores the correspondence relationship RL1. The position difference H1 corresponds to positional information in a normal direction (Z direction) of the disposition plane DP of the reflecting surface 22R of the spatial light modulation element 22 as described above.

The detection unit 5 including the control unit 25 may perform the above-described measurement a plurality of times while varying the value of the above-described designated position difference H1d, and on the basis of the plurality of calculated position differences H1 and designated position difference H1d, the designated position difference H1d may be calculated for setting the desired position difference H1.

In order to calculate the position difference H1 with higher accuracy, the control unit 25 may calculate the position difference H1 of the spatial light modulation elements 22 from an amount of detection light also on the basis of an amount of reference light, which is an amount of light of an image in an operating state in which the position difference H1 is 0 [nm], in a region such as the first region A1 of the spatial light modulator 20.

When the amount of reference light is detected, the control unit 25 sends the control signal S1 to the spatial light modulator 20 to control the spatial light modulation elements 22 to be set at the same Z position. Then, similarly to the detection of the amount of detection light described above, a distribution of the amount of light of an image of the disposition plane DP of the spatial light modulator 20 formed on the imaging surface 19 of the imaging unit 18 is detected as the amount of reference light.

As an example, the control unit 25 may calculate the position difference H1 of the spatial light modulation elements 22 on the basis of a value obtained by dividing the amount of detection light in a region such as the first region A1 of the spatial light modulator 20 by the amount of reference light described above. As a result, it is possible to correct detection errors in the amount of detection light caused by an uneven transmittance or the like in the illumination system (12 to 15) or the detection optical system 10.

In order to calculate the position difference H1 with higher accuracy, it is preferable to use a region in which an intensity changes greatly with respect to an amount of change in the position difference H1 in the correspondence relationships RL1 and RL2. This region corresponds to, as an example, a region in which an intensity value is or lower and 0.2 or higher.

For example, if the spatial light modulator 20 to be measured is required to set the intensity of the specularly reflected light DLa0 with a wavelength of 193 [nm] to 0, the spatial light modulator 20 needs to set the above-described position difference H1 within a range of about 48±2 [nm] with 193/4=48.25 [nm] as an approximate center.

At this time, if light with the same wavelength of 193 [nm] is used in detecting the image of the first region A1 of the spatial light modulator 20 with the measuring device 1, the intensity of the specularly reflected light DLa0 with respect to the position difference H1 is approximately 0 as shown by the correspondence relationship RL2 in FIG. 5. Then, the intensity of the specularly reflected light DLa0 hardly changes with respect to the change of the position difference H1 in the vicinity of 48 [nm]. Therefore, the light with the wavelength of 193 [nm] is not suitable for accurately measuring a value of the position difference H1 in the vicinity of 48 [nm].

On the other hand, if light with a wavelength of 546 [nm] is used in detecting the image of the first region A1 of the spatial light modulator 20 with the measuring device 1, the intensity of the specularly reflected light DLa0 at the position difference H1 of 48 [nm] is about 0.7 as shown by the correspondence relationship RL2 in FIG. 5. Then, the intensity of the specularly reflected light DLa0 also changes greatly with respect to a change of the position difference H1 in the vicinity of 48 [nm].

Therefore, when an operation of the spatial light modulator 20 in which the intensity of the specularly reflected light DLa0 with a wavelength of 193 [nm] is required to be 0 is measured, as an example, it is preferable to use light with a wavelength of 546 [nm] as the illumination light ILa and ILb.

Further, more generally, when an operation of the spatial light modulator 20 in which the intensity of the specularly reflected light DLa0 with a wavelength $\lambda 1$ is required to be 0 is measured, light of a wavelength $\lambda 2$, which is 1.5 times or more and 3.3 times or less the wavelength is preferably used as the illumination light ILa and ILb. In this case, the intensity of the specularly reflected light DLa0 of the light with the wavelength $\lambda 2$ can be in a range of 0.2 to 0.8 at the position difference H1 in which the intensity of the specularly reflected light DLa0 with the wavelength $\lambda 1$ is 0, and the value of the position difference H1 can be measured with higher accuracy.

As described above, in order to measure the position difference H1 with high accuracy, it is preferable not to allow the 1st order diffracted light from the spatial light modulator 20 to be incident on the detection unit 18. Therefore, hereinafter, the numerical aperture NA2 of the detection optical system 10 will be described with reference to FIGS. 3(a) to 3(d) again.

From the spatial light modulation elements 22 of the first region A1 in the operating state illustrated in FIG. 4(b), the specularly reflected light DLa0 and the diffracted light such as the +1st order diffracted light DLap and the −1st order diffracted light DLam in the X direction are generated as described above. The +1st order diffracted light DLap is emitted in a direction inclined in the +X direction by the diffraction angle $\theta$ from the −Z direction. Here, the diffraction angle $\theta$ is an angle that satisfies a relationship of $\sin(\theta)=\lambda/(2\times PX)$ provided that a wavelength of the illumination light ILb is X. Then, the −1st order diffracted light DLam is emitted in a direction inclined in the −X direction by the diffraction angle $\theta$ from the −Z direction.

Further, since the illumination light ILb applied to the disposition plane DP has a predetermined illumination NA as described above, the specularly reflected light DLa0, the +1st order diffracted light DLap, and the −1st order diffracted light DLam are also each emitted in a direction extending in a predetermined angle range with each direction described above as a center.

As described above, FIG. 4(d) is a view illustrating positions of the specularly reflected light DLa0, the +1st order diffracted light DLap, the −1st order diffracted light DLam, and the like in the detection aperture stop 16. Since the detection aperture stop 16 is disposed on a pupil plane of the objective lens 15, the positions in the X and Y directions in FIG. 4(d) correspond to a sine (sin) of an emission angle of light emitted from the spatial light modulator 20. Specifically, a distance from the center 16c to each point on the detection aperture stop 16 is, for example, a length obtained by multiplying the sine of the emission angle of the light emitted from the spatial light modulator 20 and reaching each point by a focal length of the objective lens 15.

Center positions of the +1st order diffracted light DLap and the −1st order diffracted light DLam are positions away from the center 16c in the +X direction and the —X direction by the distance DX in the detection aperture stop 16. Here, the distance DX is a distance corresponding to $\sin(\theta)=\lambda/(2\times PX)$, which is the sine of the diffraction angle $\theta$ described above.

Therefore, if the radius NA2 of the aperture 16o, which is the numerical aperture of the detection optical system 10 on the spatial light modulator 20 side, is smaller than $\lambda/(2\times PX)$, the +1st order diffracted light DLap and the −1st order diffracted light DLam are shielded by the detection aperture stop 16 and do not reach the imaging unit 18.

The center positions of the 1st order diffracted lights (DLap, DLam, DLapp, DLapm, DLamp, and DLamm) illustrated in FIG. 4(d) are positions away from the center 16c of the detection aperture stop 16 by the distance DX in the ±X direction and the distance DY in the ±Y direction. Here, the distance DX is a distance corresponding to $\sin(\theta) = \lambda/(2\times PX)$ as described above, and the distance DY is a distance corresponding to $\sin(\theta)=\lambda/(2\times PY)$ with respect to the disposition period PY of the reflecting surfaces 22R in the Y direction.

Therefore, if the numerical aperture of the detection optical system 10 on the spatial light modulator 20 side is smaller than $\sqrt{[\{\lambda/(2\times PX)\}^2+\{\lambda/(2\times PX)\}^2]}$, the diffracted lights (DLapp, DLapm, DLamp, and DLamm) are shielded by the detection aperture stop 16 and cannot reach the imaging unit 18.

When an average of the disposition period PX of the reflecting surfaces 22R in the X direction and the disposition period PY thereof in the Y direction is P, the numerical aperture of the detection optical system 10 on the spatial light modulator 20 side is preferably set smaller than about $\sqrt{2}\times 2/(2\times P)$. Thereby, the diffracted lights (DLapp, DLapm, DLamp, and DLamm) can be shielded by the detection aperture stop 16 in the same manner as described above. The disposition period PX of the reflecting surfaces 22R in the X direction and the disposition period PY thereof in the Y direction may be the same.

Further, the diffracted lights (DLap, DLam, DLapp, DLapm, DLamp, and DLamm) also each extend in an angle range of about the illumination NA of the illumination light ILb due to the illumination NA of the illumination light ILb as described above. Therefore, the numerical aperture (NA2) of the detection optical system 10 on the spatial light modulator 20 side, which is the radius NA2 of the aperture 16o, may be set smaller than a value obtained by further subtracting the illumination NA from each value described above.

Incidentally, if the numerical aperture NA2 of the detection optical system 10 on the spatial light modulator 20 side is too small, a resolution of the detection optical system is lowered, and it is difficult to accurately separate and detect an image of the first region A1 and an image of a region other than the first region A1 on the disposition plane DP of the spatial light modulator 20. Therefore, the numerical aperture NA2 of the detection optical system 10 on the spatial light modulator 20 side is preferably set to a value larger than a value determined by $\lambda/(5\times P)$ with respect to the wavelength $\lambda$ of the illumination light ILb and the disposition period P of the spatial light modulation elements 22 described above.

From those described above, when a disposition period of the spatial light modulation elements 22 is P, and a wavelength of light detected by the detection optical system 10 is $\lambda$, the numerical aperture NA2 of the detection optical system 10 on the spatial light modulator 20 side preferably satisfies a relationship of the following expression (2).

$$\lambda/(5\times P) < NA < \sqrt{2}\times\lambda/(2\times P) \qquad (2)$$

In the detection unit 5 provided in the measuring device 1, since the number of the spatial light modulation elements 22 that can be measured in one detection increases as a field of view of the detection unit 5 becomes larger, reduction in measurement time can be achieved. Therefore, a larger field of view of the detection unit 5 is more preferable. However, it is not easy to extend the field of view of the detection unit 5 while maintaining a predetermined resolution required for measuring the operating state of the spatial light modulation elements 22, that is, while maintaining the numerical aperture NA2 of the detection optical system 10 on the spatial light modulator 20 side at a predetermined value or more.

Therefore, in the measuring device 1 of the first embodiment, a product of the field of view of the detection unit 5 on the spatial light modulator 20, that is, an outer diameter D [mm] of a detection field of view which is a field of view of the detection optical system 10, and the numerical aperture NA2 of the detection optical system 10 on the spatial light modulator 20 side is set to be, for example, 0.5 or more.

Here, the detection field of view refers to a range in which an image is captured by the imaging surface 19 of the imaging unit 18 on the spatial light modulator 20, and corresponds to a range obtained by reducing (or enlarging) the range of the imaging surface 19 by an absolute value of an image-forming magnification (horizontal magnification) of the detection optical system 10.

Also, the outer diameter of the detection field of view refers to a maximum length among lengths from any one end to the other end of the detection field of view.

Further, if the detection field of view of the detection unit 5 is narrower than the disposition plane DP on which the spatial light modulator elements 22 of the spatial light modulator 20 to be measured are disposed, measurement on the entire disposition plane DP may be performed using the moving mechanism 27 described above. That is, measurement over the entire surface of the disposition plane DP may be performed by performing the measurement a plurality of times with the detection unit 5 while moving relative positions of the spatial light modulator 20 and the detection optical system 10 by the moving mechanism 27.

In the above-described description, the measuring device 1 has been configured to perform measurement on the spatial light modulator 20 having the plurality of spatial light modulation elements 22 movable in the Z direction. However, as illustrated in FIG. 6, the object to be measured by the measuring device 1 may be an angle modulation type spatial light modulator 20r having the plurality of spatial light modulation elements 22 each rotatable within a predetermined angle range.

Figure 6:
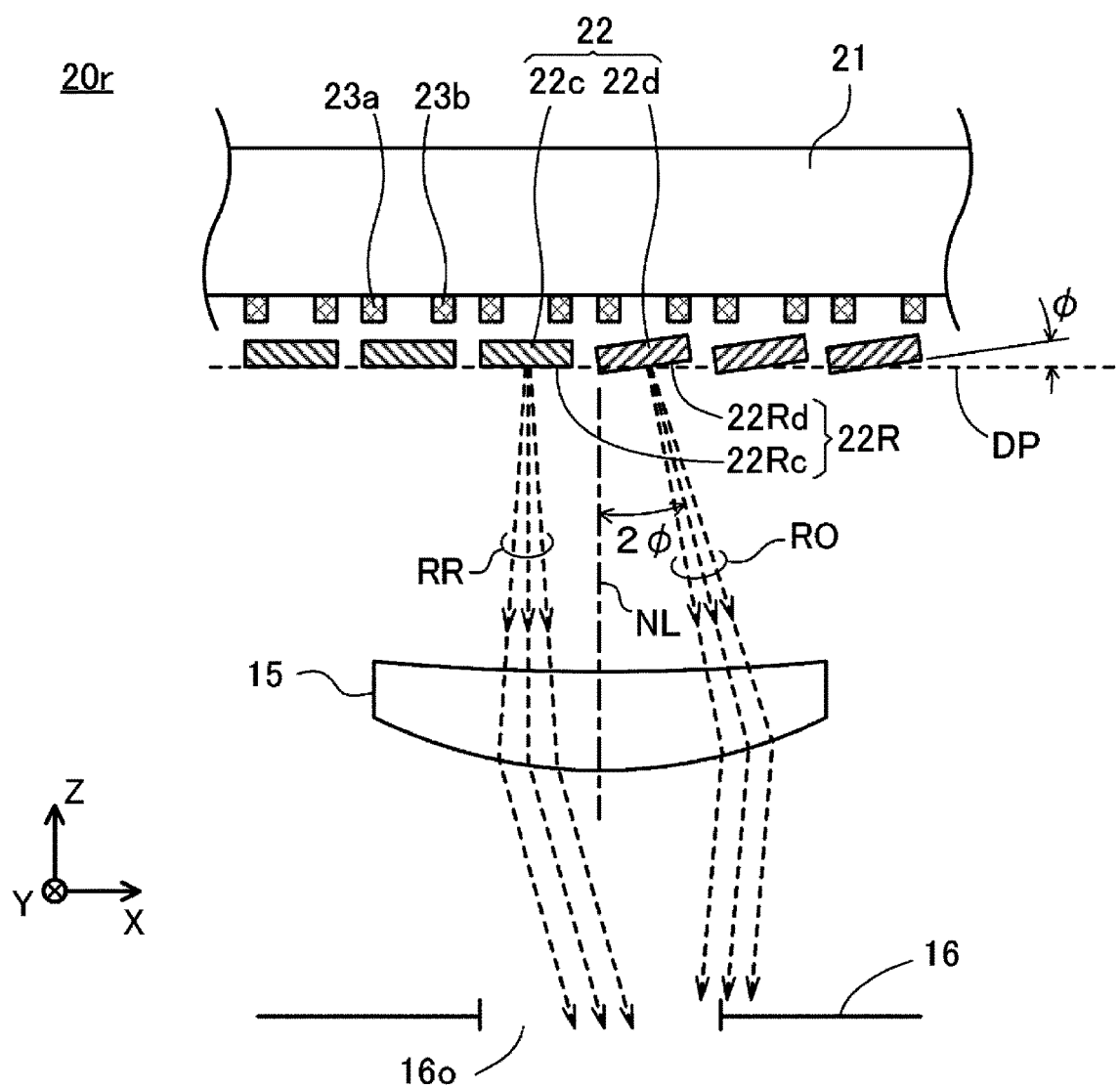
FIG. 6 is a view schematically explaining a principle of modulating an amount of specularly reflected light due to a spatial light modulator with another configuration.

FIG. 6 is a cross-sectional view of a part of the angle modulation type spatial light modulator 20r and the objective lens 15 illustrated in FIG. 1 from the +Y direction, and is a view similar to FIG. 4(c) described above. Therefore, the reference signs illustrated in FIGS. 1 to 4 will also be referred to and described below. Further, also in FIG. 6, illustration of the illumination light ILb (see FIG. 1) applied to the spatial light modulator 20r from the −Z direction is omitted to avoid the drawing becoming complicated as in FIG. 4(c).

Each of the spatial light modulation elements 22 is held by the housing 21 of the spatial light modulator 20 via a holding member (not illustrated) having elasticity that is rotatable within a predetermined angle range with the Y direction as a rotation axis. Counter electrodes 23a and 23b are disposed at portions of the housing 21 of the spatial light modulator 20r that face the +Z side of each spatial light modulation element 22. If a predetermined voltage is applied to the counter electrodes 23a and 23b from the modulation control unit 24 (see FIG. 1) (not illustrated), each spatial light modulation element 22 is set at an angular position rotated by a predetermined angle according to the voltage applied to the facing counter electrodes 23a and 23b.

The reflecting surface 22R is formed on a surface of each spatial light modulation element 22 on the −Z side.

In the operating state illustrated in FIG. 6, when a voltage is applied to the counter electrodes 23a and 23b, spatial light modulation elements 22c that are a part of the plurality of spatial light modulation elements 22 are disposed such that reflecting surfaces 22Rc thereof are parallel to the disposition plane DP. On the other hand, spatial light modulation elements 22d that are a part of the plurality of spatial light modulation elements 22 are disposed such that reflecting surfaces 22Rd thereof are rotated by an angle φ from the disposition plane DP with the Y direction as a rotation center.

Illumination light (see FIG. 1) applied to the spatial light modulation elements 22c is reflected substantially in the −Z direction by the reflecting surfaces 22Rc parallel to the disposition plane DP and is incident on the objective lens 15 as reflected light RR. Then, the light passes through the aperture 16o of the detection aperture stop 16, passes through the image-forming lens 17, reaches the imaging unit 18 (see FIG. 1 for all of which), and forms an image of the spatial light modulation element 22c on the imaging surface 19.

On the other hand, illumination light applied to the spatial light modulation elements 22d rotated by the angle φ is reflected in a direction away from the −Z direction to the −X direction by an angle of approximately 2φ by the reflecting surfaces 22Rc and is incident on the objective lens 15 as reflected light RO. Then, at least some of the light is shielded by the detection aperture stop 16.

Further, since the illumination light ILb applied to the disposition plane DP has the predetermined illumination NA as described above, the reflected light RR and the reflected light RO are also each emitted in a direction extending in a predetermined angle range from each direction described above.

Therefore, on the imaging surface 19 of the imaging unit 18, an intensity of an image of a portion corresponding to the spatial light modulation elements 22d having the reflecting surfaces 22Rd rotated with respect to the disposition plane DP decreases according to the rotation angle of the reflecting surfaces 22Rd from the disposition plane DP.

That is, there is a predetermined correspondence relationship between a rotation angle φ of the reflecting surfaces 22Rd from the disposition plane DP in each region of the disposition plane DP and an amount of detection light detected as an amount of light of the image of each region on the disposition plane DP by each imaging pixel included in the imaging unit 18.

Therefore, the control unit 25 of the measuring device 1 can also calculate positional information on the rotation angle of the reflecting surfaces 22Rd from the disposition plane DP on the basis of the amount of detection light of the image formed on the imaging surface 19 and detected by the imaging unit 18.

Further, the rotation axis of each spatial light modulation element 22 is not limited to the axis parallel to the Y direction described above and may be a rotation axis parallel to any direction intersecting the Z axis.

Also, at the time of measurement, the reflecting surfaces 22R of the spatial light modulation elements 22 within a predetermined region to be measured may all be disposed to be rotated from the disposition plane DP by the same angle.

Further, in the measuring device of the first embodiment described above, the moving mechanism 27 has been configured to move the spatial light modulator 20 with respect to the fixed detection unit 5, but the moving mechanism 27 may be configured to move the detection unit 5 with respect to the fixed spatial light modulator 20.

That is, the moving mechanism 27 may be any moving mechanism that moves a relative position of the detection unit 5 including the detection optical system 10 with respect to the spatial light modulator 20 in an in-plane direction of the disposition plane DP.

Effects of Measuring Device of First Embodiment (1) The measuring device of the first embodiment, which is the measuring device 1 that measures the spatial light modulator 20 having the plurality of spatial light modulation elements 22 each having the reflecting surface 22R, includes the illumination system (12 to 15) that irradiates the disposition plane DP on which the reflecting surfaces 22R of the plurality of spatial light modulation elements 22 are disposed with light, and the detection optical system 10 that forms an image of the disposition plane DP on the basis of light from the plurality of reflecting surfaces 22R. The measuring device further includes the imaging unit 18 that detects the image of the disposition plane DP formed by the detection optical system 10, and the control unit 25 that calculates positional information of the reflecting surfaces 22R of the spatial light modulation elements 22 in a normal direction (Z direction) of the disposition plane DP or positional information on rotation angles of the reflecting surfaces 22R of the spatial light modulation elements 22 from the disposition plane DP on the basis of an amount of detection light which is an amount of light of the image detected by the imaging unit 18.

With this configuration, an operating state of the spatial light modulation elements 22 included in the spatial light modulator 20 can be accurately measured.

Measuring Device of Second Embodiment

Hereinafter, a measuring device 1a of a second embodiment will be described. In the following description, of configurations of the measuring device 1a of the second embodiment, portions that are common to the configurations of the measuring device 1 of the first embodiment described above will be denoted by the same reference signs, and description thereof will be omitted as appropriate. Configurations of a spatial light modulator 20, aspatial light modulation element 22, and a reflecting surface 22R which are referred to in the following description are also the same as those described with reference to FIGS. 2, 4, and 6 described above.

Figure 7:
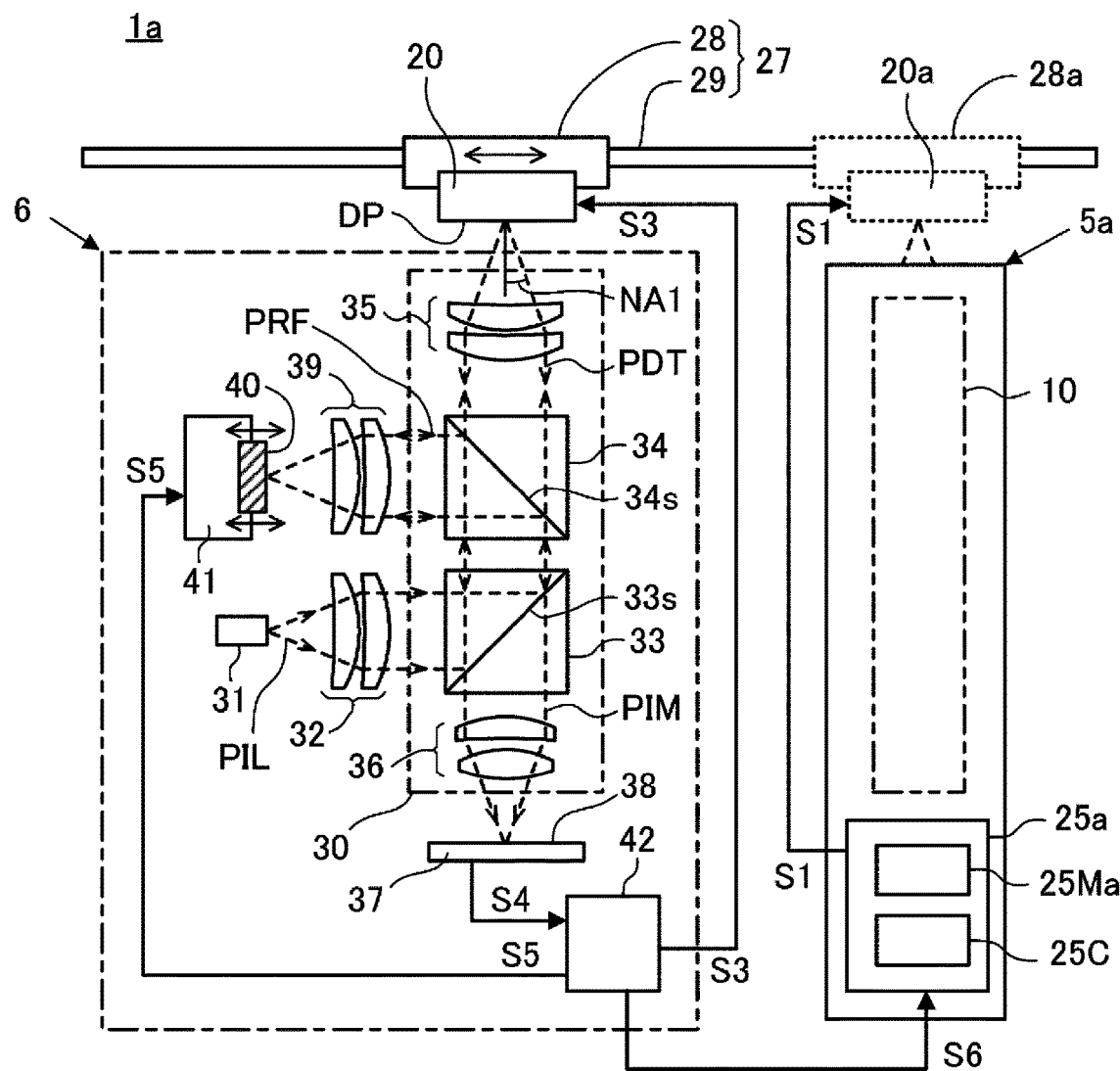
FIG. 7 is a view schematically illustrating a configuration of a measuring device according to a second embodiment.

FIG. 7 is a view schematically illustrating a configuration of the measuring device 1a of the second embodiment. The measuring device 1a of the second embodiment is a device for measuring an operating state of the spatial light modulator 20 in the same way as the measuring device 1 of the first embodiment described above. The measuring device 1a of the second embodiment includes a first detection unit 6 and a second detection unit 5a that detect an image of a disposition plane DP of the spatial light modulator 20 on the basis of light from the reflecting surface of the spatial light modulator 20. The second detection unit 5a has a detection field of view larger than a detection field of view of the first detection unit 6.

The measuring device 1a of the second embodiment includes a moving mechanism 27 similarly to the measuring device 1 of the first embodiment described above. The spatial light modulator 20 is held by a holding part 28 that constitutes the moving mechanism 27, and the holding part 28 is movable in an X direction (or, further in a Y direction) along a guide part 29. The moving mechanism 27 in the second embodiment switches a positional relationship between the first detection unit 6 and the second detection unit 5a, and the spatial light modulator 20 to either a first positional relationship in which the spatial light modulator 20 faces the first detection unit 6 and a second positional relationship in which the spatial light modulator 20 faces the second detection unit 5a. Therefore, the moving mechanism 27 is also referred to as a position changing mechanism 27 below.

The first detection unit 6 includes a detection light source 31, a light-transmitting lens 32, a first branching element 33, a second branching element 34, an objective lens 35, an image-forming lens 36, and a reference lens 39, a reference reflecting surface 40, a movable support part 41, an imaging unit 37, and a first control unit 42 within a region surrounded by a dashed-dotted line in FIG. 7.

The second detection unit 5a has, as an example, the same configuration as the detection unit 5 (see FIG. 1) included in the measuring device 1 of the first embodiment described above. Therefore, the second detection unit 5a includes a second detection optical system 10a and a second control unit 25a similar to the detection optical system and the control unit 25 of the detection unit 5 described above. Further, in FIG. 7, illustration of members constituting the second detection unit 5a is omitted except for the second detection optical system 10a and the second control unit 25a.

Similarly to the control unit 25 included in the measuring device 1 of the first embodiment described above, the second control unit 25a of the second detection unit 5a calculates positional information of the reflecting surface 22R of the spatial light modulation element 22 on the basis of an amount of detection light obtained by detecting an image of the disposition plane DP. Therefore, the second control unit 25a can also be said to be a calculation unit.

In the first detection unit 6, the light-transmitting lens 32, the first branching element 33, the second branching element 34, and the objective lens 35 constitute a first illumination system that irradiates the disposition plane DP of the spatial light modulation elements 22 constituting the spatial light modulator 20 with light.

Also, the objective lens 35, the second branching element 34, the first branching element 33, and the image-forming lens 36 included in a portion surrounded by a double-dotted-dashed line constitute a first detection optical system 30 that forms the image of the disposition plane DP on an imaging surface 38 of the imaging unit 37 such as a solid-state imaging device.

Illumination light emitted from the detection light source 31 passes through an illumination optical path PIL, is substantially collimated by the light-transmitting lens 32, is incident on the first branching element 33, is reflected by a branching surface 33s of the first branching element 33, and then is incident on the second branching element 34. Then, the illumination light is amplitude-divided into detection light which is light that passes through the branching surface 34s and passes through a detection optical path PDT, and reference light which is light that is reflected by the branching surface 34s and passes through a reference optical path PRF.

The detection light passing through the detection optical path PDT is focused by the objective lens 35 and applied to the disposition plane DP of the spatial light modulator 20. Then, the detection light is reflected by the disposition plane DP, passes through the objective lens 35 and the detection optical path PDT again, and reaches the second branching element 34.

The reference light passing through the reference optical path PRF is focused by the reference lens 39 and applied to the reference reflecting surface 40. Then, the reference light is reflected by the reference reflecting surface 40, passes through the reference lens 39 and the reference optical path PRF again, and reaches the second branching element 34.

The detection light that has passed through the branching surface 34s of the second branching element 34 and the reference light reflected by the branching surface 34s of the second branching element 34 are combined into one light, and this passes through an image-forming optical path PIM, is focused by the image-forming lens 36, and is incident on the imaging surface 38 of the imaging unit 37.

That is, among members constituting the first detection unit 6, members such as the second branching element 34, the objective lens 35, the image-forming lens 36, the reference lens 39, the reference reflecting surface 40, and the movable support part 41 constitute a so-called interference microscope unit. Therefore, if a difference in optical path length between the detection optical path PDT and the reference optical path PRF is equal to or less than a coherence length of the illumination light emitted from the detection light source 31, an image (interference image) formed by amplitude interference between an image of the disposition plane DP and an image of the reference reflecting surface 40 is formed on the imaging surface 38. The interference image between the disposition plane DP and the reference reflecting surface 40 is detected by the imaging unit 37, that is, photoelectrically converted into an electrical signal, and transmitted to the first control unit 42 as an image signal S4.

A position (X position) of the reference reflecting surface 40 in the ±X direction, which is a traveling direction of the reference optical path PRF, is movable by the movable support part 41 that holds the reference reflecting surface 40. Since an optical path length of the reference optical path PRF changes as the reference reflecting surface moves in the X direction, an intensity of the interference image between the disposition plane DP and the reference reflecting surface 40 changes. The first control unit 42 performs signal processing on the image signal S4 detected by the imaging unit 37 while sending a control signal S5 to the movable support part 41 to change the X position of the reference reflecting surface 40. The first control unit 42 performs signal processing on the image signal S4 detected by the imaging unit 37 while sending a control signal S5 to the movable support part 41 to change the X position of the reference reflecting surface 40.

The first control unit 42 measures the Z position of the reflecting surface 22R on the basis of a change in intensity of the interference image between the image of the reflecting surface 22R of one spatial light modulation element 22 disposed on the disposition plane DP and the image of the reference reflecting surface 40, and the X position of the reference reflecting surface 40.

The interference microscope unit (34 to 36, 39 to 41) and the first control unit 42 described above function as a position measurement unit that measures positional information of the reflecting surface 22R of the spatial light modulation element 22 in the Z direction.

Further, the configuration of the position measurement unit is not limited to the configuration of the interference microscope units (34 to 36, 39 to 41) described above. For example, the optical path length of the detection optical path PDT may be changed by moving the entire first detection unit 6 in the Z direction instead of moving the reference reflecting surface 40 in the X direction by the movable support part 41. Alternatively, the first detection optical system 30 may be functioned as a position measurement unit by forming a conjugate plane with respect to the disposition plane DP in the first detection optical system 30 and disposing a Nipkow disc (Nipkow filter) on the conjugate plane.

Since the first detection unit 6 individually measures the Z position of the reflecting surface 22R of one spatial light modulation element 22, a resolution thereof may be set high. For this, a numerical aperture NA1 of the first detection optical system 30 on the spatial light modulator 20 side may be set larger than a numerical aperture NA2 of the second detection optical system on the spatial light modulator 20 side in the second detection unit 5a.

The detection light source 31 may be an LED as an example. Also, the detection light source 31 may be a laser light source as long as it is configured to use the Nipkow disc described above. The light-transmitting lens 32, the objective lens 35, and the image-forming lens 36 are not limited to the configuration including the illustrated number (two) of lenses and may be configured to include any number of lenses, and all of them may be configured to include a reflection optical system. The first branching element 33 and the second branching element 34 are configured by a beam splitter, a half mirror made of flat glass, or the like as in the branching element 14 of the first embodiment described above.

Prior to measurement, the first control unit 42 sends a control signal S3, which is for setting a position of the reflecting surface 22R of the spatial light modulation element 22 to be measured to a predetermined designated position, to the spatial light modulator The control signal S3 is a control signal similar to the control signal S1 transmitted from the control unit 25 of the detection unit 5 to the spatial light modulator 20 in the measuring device 1 of the first embodiment described above.

Thereby, the first detection unit 6 including the first control unit 42 can detect a difference between the above-described designated position of the reflecting surface 22R of the spatial light modulation element 22 and a measured position of the reflecting surface 22R, that is, an actual set position at which the reflecting surface 22R is actually set, as a detection result.

The first detection unit 6 including the first control unit 42 may set the predetermined reflecting surfaces 22R to a plurality of designated positions different from each other according to the control signal S3 and detect the actual set position of each of the reflecting surfaces 22R. Thereby, the first control unit 42 may detect the position set relationship FR shown in FIG. 3 as a detection result.

The first detection unit 6 may detect the position set relationships FR over the entire range of the designated positions of the spatial light modulation elements 22, or may detect the position set relationships FR only for a partial range of the designated positions of the spatial light modulation elements 22.

The first control unit 42 in the first detection unit 6 may transmit detection results such as the position set relationship FR to the second control unit 25a in the second detection unit 5a as an information signal S6. The second control unit 25a in the second detection unit 5a may calculate the position difference H1 described above also using the detection results such as the position set relationship FR.

Specifically, in the second detection unit 5a having the same configuration as the detection unit 5 described above, a position corrected to an actual set position on the basis of the detection results such as the position set relationship FR received from the first detection unit 6 may be used as the designated position of the reflecting surface 22R of the spatial light modulation element 22 designated at the time of measurement.

Effects of Measuring Device of Second Embodiment (2) The measuring device 1a of the second embodiment described above includes the first detection unit 6 which detects light from the reflecting surfaces 22R of the spatial light modulator 20 having the plurality of spatial light modulation elements 22 having the reflecting surfaces 22R disposed on the disposition plane DP, and the second detection unit 5a which is a detection unit detecting light from the reflecting surfaces 22R and has a detection field of view larger than that of the first detection unit 6. Also, the position changing mechanism 27 is further provided for changing the positional relationship between the first detection unit 6 and the second detection unit 5a, and the spatial light modulator 20 to either the first positional relationship in which the spatial light modulator 20 faces the first detection unit 6 and the second positional relationship in which the spatial light modulator 20 faces the second detection unit 5a.

With this configuration, the spatial light modulation element 22 disposed in a relatively narrow range in the disposition plane DP of the spatial light modulation elements 22 can be measured with high accuracy by the first detection unit 6, and a large number of the spatial light modulation elements 22 disposed in a relatively wide range can be collectively measured at high speed by the second detection unit 5a.

Incidentally, if there is a manufacturing error or the like in the spatial light modulator 20, the correspondence relationship RL1 shown in FIG. 5, which is a relationship between an intensity of the specularly reflected light DLa0 from a predetermined region of the disposition plane DP and the position difference H1 of the spatial light modulation elements 22, may deviate from the relationship represented by expression (1) described above. In this case, there is a likelihood that an error will occur in a measured value of the position difference H1 of the spatial light modulation elements 22 by the second detection unit 5a.

In the measuring device 1a of the second embodiment, as described above, the Z position (actual set position) of the reflecting surface 22R of the predetermined spatial light modulation element 22 in the disposition plane DP of the spatial light modulation elements 22 can be measured (detected) by the first detection unit 6 with high accuracy. Thereby, as described below, the actual correspondence relationship RL1 between the intensity of the specularly reflected light DLa0 and the position difference H1 of the spatial light modulation elements 22 can be accurately measured using the first detection unit 6 and the second detection unit 5a.

Measuring Method of Third Embodiment

Hereinafter, a measuring method of a third embodiment will be described. The measuring method of the third embodiment is a measuring method using the measuring device 1a of the second embodiment described above. Further, the following description also includes description on the measuring device 1a of the second embodiment.

At the time of measuring the correspondence relationship RL1 described above, the measuring device 1a first disposes the first region A1 (FIG. 2(a)), which is an arbitrary region in the disposition plane DP of the spatial light modulator 20, to face the first detection unit 6 by using the position changing mechanism 27.

In this state, the first control unit 42 of the first detection unit 6 sends the control signal S3 to the spatial light modulator 20 to set the Z position of the spatial light modulation element 22 disposed in the first region A1 as illustrated in FIG. 4(a) or FIG. 4(b). That is, the Z positions of the reflecting surfaces 22Ra of the spatial light modulation elements 22a of the first group and the reflecting surfaces 22Rb of the spatial light modulation elements 22b of the second group, which are alternately disposed in the first region A1, are set to be different by the predetermined designated position difference H1d (see FIG. 2(c)).

In this state, the first detection unit 6 measures at least one actual set position of the reflecting surfaces 22Ra of the spatial light modulation elements 22a of the first group and at least one actual set position of the reflecting surfaces 22Rb of the spatial light modulation elements 22b of the second group. Then, the first control unit 42 detects the position difference H1 which is a difference between the two measured actual set positions. The position difference H1 is distance information in the Z direction between the reflecting surface 22Ra and the reflecting surface 22Rb.

The first control unit 42 of the first detection unit 6 transmits detection results including the designated positions and the measured actual set positions of the reflecting surface 22Ra and the reflecting surface 22Rb, or the designated position difference H1d and the measured position difference H1 between the reflecting surface 22Ra and the reflecting surface 22Rb to the second control unit 25a in the second detection unit 5a as the information signal S6.

Next, the measuring device 1a disposes the first region A1 in the disposition plane DP of the spatial light modulator 20 to face the second detection unit 5a using the position changing mechanism 27. A spatial light modulator 20a illustrated by the dotted line in FIG. 7 illustrates an operating state in which the spatial light modulator 20 is disposed to face the second detection unit 5a, and a holding part 28a illustrated by the dotted line indicates the holding part 28 at that time.

In this state, the second control unit 25a of the second detection unit 5a sends the control signal S1, that is similar to the control signal S3 transmitted by the first control unit 42 of the first detection unit 6 in the above description, to the spatial light modulator Thereby, the reflecting surfaces 22Ra of the spatial light modulation elements 22a of the first group and the reflecting surfaces 22Rb of the spatial light modulation elements 22b of the second group, which are alternately disposed in the first region A1, are set at different positions in the Z direction by a predetermined designated position difference H1d similarly to when they face the first detection unit 6. The position difference H1 between the reflecting surface 22Ra and the reflecting surface 22Rb at that time is known from the above-described detection result transmitted as the information signal S6 from the first control unit 42 of the first detection unit 6.

The second detection unit 5a detects an intensity of the specularly reflected light DLa0 from the first region A1 in this state, that is, an amount of detection light of an image of the first region A1 formed on the imaging surface 19 (see FIG. 1).

Then, a calculation unit 25C provided in the second control unit 25a of the second detection unit 5a calculates the correspondence relationship RL1 on the basis of the position difference H1 of the spatial light modulation elements 22 detected by the first detection unit 6 and the amount of detection light which is the intensity of the specularly reflected light DLa0 detected by the second detection unit 5a. The second control unit 25a stores the calculated correspondence relationship RL1 in a storage unit 25Ma.

In calculating the correspondence relationship RL1, as an example, a value of a correction coefficient α or a correction coefficient β in expression (3) obtained by modifying the above-described expression (1) may be optimized to determine the correspondence relationship RL1.

$$RL1 = \alpha + \beta \times \{1 + \cos(4\pi \times H1/\lambda)\}/2 \quad (3)$$

That is, the correspondence relationship based on the detection result can be determined by determining the correction coefficient α or the correction coefficient β of expression (3) such that the RL1 value on the left-hand side of expression (3) or expression (4) calculated by the position difference H1 is coincident with the value of the detected amount of detection light. At this time, the correction coefficient β may be set to 1 when the correction coefficient α is a value other than 0, and at this time, the correction coefficient α may be set to 0 when the correction coefficient β is a value other than 1.

Further, the correspondence relationship RL1 may be calculated on the basis of values of a plurality of sets of the position difference H1 and an amount of reference light. That is, the above-described measurement may be performed a plurality of times by setting the reflecting surface 22Ra and the reflecting surface 22Rb at the Z positions that are different by different designated position differences H1d, and the correction coefficient α and the correction coefficient β in the above expression (3) may be determined from the obtained values of the plurality of sets of the position difference H1 and the amount of reference light. In determining the correction coefficient α and the correction coefficient β, for example, an optimization method such as a least-squares method may be used.

Also, when the correspondence relationship RL1 is calculated on the basis of the values of the plurality of sets of the position difference H1 and the amount of reference light, instead of using the above expression (3), any other function such as a sum of power series may be used.

The correspondence relationship RL1 calculated as described above can also be applied to the spatial light modulation elements 22 disposed in a region other than the first region A1 on the disposition plane DP of the spatial light modulator 20. Then, using the correspondence relationship RL1, it is possible to measure the position difference H1 of the spatial light modulation elements 22 disposed in an arbitrary region such as, for example, the second region A2 illustrated in FIG. 2(a) other than the first region A1.

For this, the measuring device 1a disposes the second region A2 in the disposition plane DP of the spatial light modulator 20 to face the second detection unit 5a using the position changing mechanism 27.

Then, the second control unit 25a of the second detection unit 5a sends the control signal S1 to the spatial light modulator 20 and disposes the spatial light modulation elements 22 in the second region A2 to be apart from the disposition plane DP by the designated position difference H1$d$ in the Z direction in the same disposition as described above. That is, the plurality of spatial light modulation elements 22 in the second region A2 are disposed similarly to the disposition in the first region A1 illustrated in FIG. 4($a$) or 4($b$).

In the second region A2, the spatial light modulation elements 22 corresponding to the spatial light modulation elements 22$a$ of the first group illustrated in FIG. 4($a$) or 4($b$) are referred to as spatial light modulation elements of a third group. Also, in the second region A2, the spatial light modulation elements 22 corresponding to the spatial light modulation elements 22$b$ of the second group are referred to as spatial light modulation elements of a fourth group.

The reflecting surface 22R of the spatial light modulation element of the third group is disposed apart from the reflecting surface 22R of the spatial light modulation element of the fourth group by the designated position difference H1$d$ in the Z direction.

Further, since the measurement of the position set relationship FR by the first detection unit 6 described above is not performed for the spatial light modulation elements 22 in the second region A2, the actual position difference H1 between the reflecting surface 22R of the spatial light modulation element of the third group and the reflecting surface 22R of the spatial light modulation element of the fourth group is unknown accurately.

The second detection unit 5$a$ detects an intensity of the specularly reflected light DLa0 from the second region A2 in this state, that is, an amount of detection light of an image of a portion corresponding to the second region A2 formed on the imaging surface 19 (see FIG. 1).

The second control unit 25$a$ of the second detection unit 5$a$ measures the position difference H1, which is distance information in the Z direction between the reflecting surface 22R of the spatial light modulation element of the third group and the reflecting surface 22R of the spatial light modulation element of the fourth group on the basis of the detected amount of detection light and the correspondence relationship RL1 calculated above.

The second detection unit 5$a$ including the second control unit 25$a$ may perform the above-described measurement a plurality of times while varying the value of the above-described designated position difference H1$d$. Then, a desired designated position difference, which is the designated position difference H1$d$ for setting the desired position difference H1, may be calculated on the basis of relationships between the plurality of measured and calculated position differences H1 and designated position differences H1$d$.

As described above, the second detection unit 5$a$ has a detection field of view larger than a detection field of view of the first detection unit 6. When the first region A1 and the second region A2 are present simultaneously within the detection field of view of the second detection unit 5$a$, measurement of the second region A2 can be performed without moving the spatial light modulator 20 using the position changing mechanism 27 after measuring the first region A1 with the second detection unit 5$a$. Thereby, the measurement time can be reduced. Also, the measurement time can be further reduced by simultaneously measuring a wide range of the second region A2 at one time.

Effects of Measuring Method of Third Embodiment (3) The measuring method of the third embodiment described above, which is a measuring method using the spatial light modulator 20 having the plurality of spatial light modulation elements 22 each having the reflecting surface 22R, includes setting the reflecting surfaces 22Ra of the spatial light modulation elements 22$a$ of the first group and the reflecting surfaces 22Rb of the spatial light modulation elements 22$b$ of the second group at different positions in the normal direction (X direction) of the disposition plane DP for the spatial light modulation elements 22$a$ of the first group and the spatial light modulation elements 22$b$ of the second group which are alternately disposed in the first region A1 of the disposition plane DP on which the reflecting surfaces 22R of the plurality of spatial light modulation elements 22 are disposed, and measuring distance information in the normal direction between at least one of the reflecting surfaces 22Ra of the first group and at least one of the reflecting surfaces 22Rb of the second group by the first detection unit 6. Also, the measuring method includes measuring an amount of reference light, which is an amount of light of an image of a portion corresponding to the first region A1, by the imaging-type second detection unit 5$a$, and calculating the correspondence relationship RL1 between a distance in the normal direction between the reflecting surface 22Ra of the first group and the reflecting surface 22Rb of the second group, and an amount of light of the image on the basis of the measured distance information and amount of reference light. Further, the measuring method includes setting the reflecting surfaces 22R of the spatial light modulation elements (22$a$) of the third group and the reflecting surfaces 22R of the spatial light modulation elements (22$b$) of the fourth group, which are alternately disposed in the second region A2 that is different from the first region A1 in the disposition plane DP, at different positions in the normal direction of the disposition plane DP, measuring an amount of detection light, which is an amount of light of an image of a portion corresponding to the second region A2, by the second detection unit 5$b$, and calculating distance information in the normal direction between the reflecting surfaces 22R of the spatial light modulation elements (22$a$) of the third group and the reflecting surfaces 22R of the spatial light modulation elements (22$b$) of the fourth group in the second region A2 on the basis of the amount of detection light and the correspondence relationship RL1.

Although a relatively long time is required to measure the correspondence relationship RL1 using the first detection unit 6, in this configuration, since the correspondence relationship RL1 is measured for the first region A1 in the disposition plane DP, and measurement for another region (second region A2) using the second detection unit 5$a$ can be performed using the correspondence relationship RL1, the measurement time can be reduced.

Exposure Apparatus of Fourth Embodiment

Figure 8:
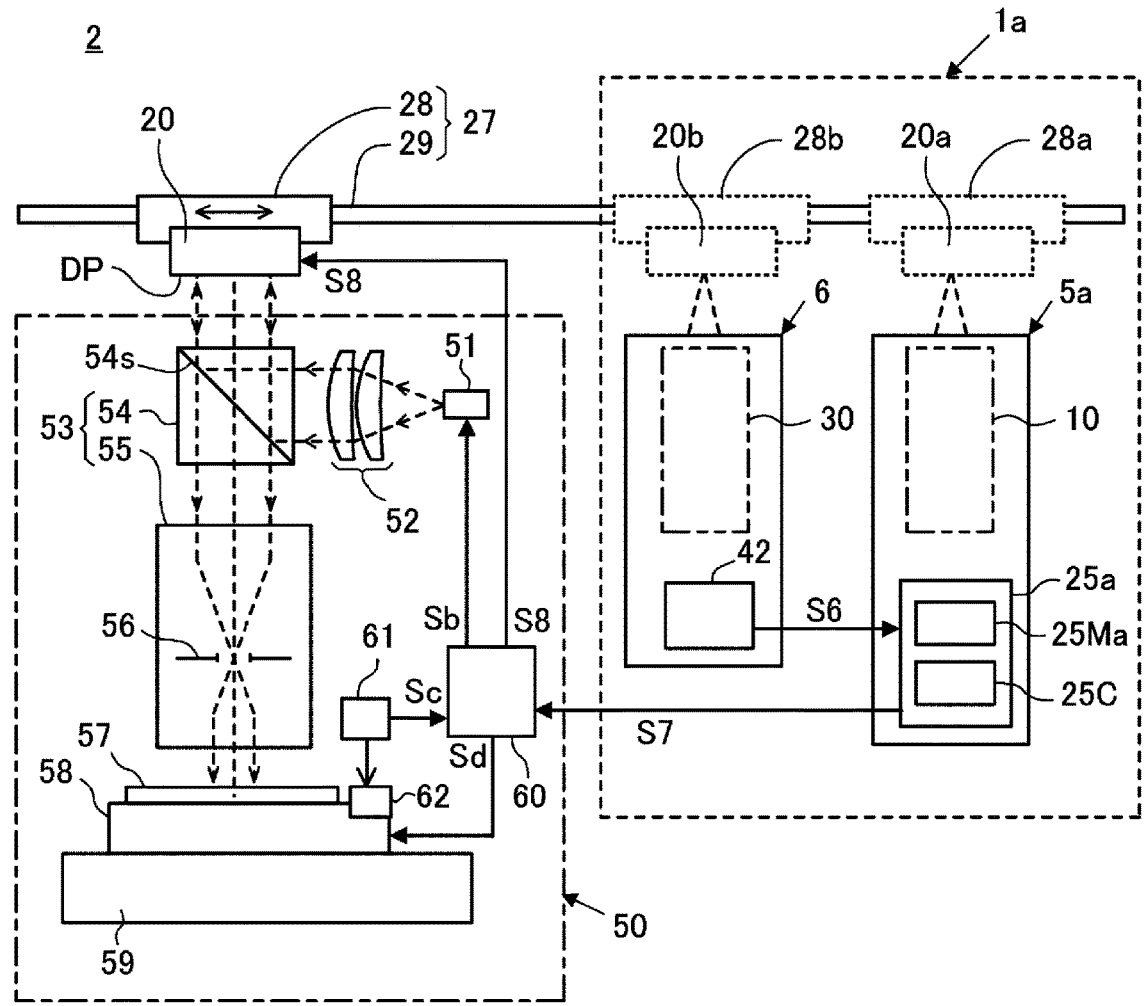
FIG. 8 is a view schematically illustrating a configuration of an exposure apparatus according to a fourth embodiment.

FIG. 8 is a view schematically illustrating a configuration of an exposure apparatus 2 of a fourth embodiment. The exposure apparatus 2 of the fourth embodiment includes the measuring device 1$a$ of the second embodiment described above surrounded by the broken line in FIG. 8, and an exposure unit 50. The measuring device 1$a$ included in the exposure apparatus 2 of the fourth embodiment may have any of the above-described configurations and features of the measuring device 1$a$ of the second embodiment.

The exposure unit 50 provided in the exposure apparatus 2 of the fourth embodiment is a projection exposure unit that projects a light and dark pattern of light modulated by the spatial light modulator 20 described with reference to FIGS. 2, 4, and the like on an exposed substrate 57 such as a silicon substrate or a glass substrate having a photosensitive material formed on a surface thereof.

The measuring device 1a of the exposure apparatus 2 of the fourth embodiment includes the first detection unit 6 and the second detection unit 5a as described above. Then, a detection field of view of the second detection unit is larger than a detection field of view of the first detection unit 6. In the exposure apparatus 2 of the fourth embodiment, a position changing mechanism 27 sets the spatial light modulator 20 at any one position of a first position facing the first detection unit 6, a second position facing the second detection unit 5a, and a third position facing the exposure unit 50.

A spatial light modulator 20b indicated by the dotted line in FIG. 8 illustrates the spatial light modulator 20 set at the first position, and a spatial light modulator 20a also indicated by the dotted line illustrates the spatial light modulator 20 set at the second position. Also, holding parts 28b and 28a indicated by dotted lines represent positions of a holding part 28 when the spatial light modulators 20b and 20a set at the second position and the first position are held.

A positional relationship in which the spatial light modulator 20 faces the first detection unit 6 at the first position is also referred to as a first positional relationship. A positional relationship in which the spatial light modulator 20 faces the second detection unit 5b at the second position is also referred to as a second positional relationship. Also, a positional relationship in which the spatial light modulator 20 faces the exposure unit 50 at the third position is also referred to as a third positional relationship.

Further, the position changing mechanism 27 may set the spatial light modulator at either the first position or the second position described above. In this case, another moving mechanism for moving the spatial light modulator 20 from the above-described first position or second position to the above-described third position may be further provided.

The exposure unit 50 of the exposure apparatus 2 of the fourth embodiment includes a light-transmitting lens 52, a branching element 54, an image-forming optical system 55, a projection aperture stop 56, a sample table 58, a stage 59, a third control unit and the like.

Of these, the light-transmitting lens 52 and the branching element 14 constitute an exposure illumination optical system that illuminates the disposition plane DP of the spatial light modulator 20 using exposure illumination light emitted from an exposure light source 51. The branching element 54, the image-forming optical system 55, and the projection aperture stop 56 constitute a projection optical system 53 that projects light from the spatial light modulator 20 to the exposed substrate 57.

The exposure illumination light emitted from the exposure light source 51 is shaped by the light-transmitting lens 52, incident on the branching element 54 such as a beam splitter, reflected by a branching surface 54s of the branching element 14, and applied to the disposition plane DP of the spatial light modulator 20. Then, the exposure illumination light is reflected by a plurality of reflecting surfaces 22R (see FIG. 2) disposed in the vicinity of the disposition plane DP, is incident on the branching element 54 again, passes through the branching surface 54s of the branching element 14, and is incident on the image-forming optical system 55.

A numerical aperture of the projection optical system 53 on the spatial light modulator 20 side is defined by the projection aperture stop 56 included in the image-forming optical system 55. When the numerical aperture of the projection optical system 53 on the spatial light modulator 20 side is set to a predetermined value, the above-described 1st order diffracted light or the like generated from the spatial light modulation elements 22 (see FIGS. 2 and 4) disposed on the disposition plane DP of the spatial light modulator 20 is shielded by the projection aperture stop 56.

Therefore, when a predetermined displacement is applied to the spatial light modulation elements 22 disposed in a predetermined region (first region A1 or the like) in the disposition plane DP, an amount of light of the light passing through the image-forming optical system 55 and applied to the exposed substrate 57 can be locally reduced, and a light and dark pattern can be projected onto the exposed substrate 57. The third control unit 60 sends a control signal S8 similar to the control signal S1 and the control signal S3 described above to the spatial light modulator 20 to apply a displacement with a predetermined amount of displacement to the predetermined spatial light modulation elements 22 in the disposition plane DP.

In the exposure apparatus 2, the exposed substrate 57 is placed on the sample table 58 disposed on the stage 59. The exposed substrate 57 is movable on the stage 59 in the X and Y directions by the sample table 58. Also, the exposed substrate 57 is also movable by a very small distance in the Z direction by the sample table 58, and furthermore, can be rotated (tilted) by a very small angle with the X and Y directions as rotation axes.

Positions of the exposed substrate 57 in the X and Y directions are measured by a position measurement unit 61 via a position of a scale plate 62 provided on the sample table 58 and transmitted to the third control unit 60 as a measurement signal Sc. The third control unit 60 sends a position control signal Sd to the sample table 58 on the basis of the measurement signal Sc to control the exposed substrate 57 to be disposed at a predetermined X position and Y position.

The third control unit 60 sends an exposure control signal Sb to the exposure light source 51 to control a light emission timing and an amount of light emission of the exposure light source 51.

The exposure unit 50 may be a scanning type exposure apparatus that performs exposure while scanning the exposed substrate 57 and the sample table 58 relative to the projection optical system 53 in the XY in-plane direction. Alternatively, the exposure unit 50 may be a step-and-repeat type exposure apparatus in which exposure is performed with the exposed substrate 57 and the sample table 58 fixed to the projection optical system 53, and the exposed substrate 57 and the sample table 58 are sequentially moved with respect to the projection optical system 53 after the exposure ends.

A wavelength of the exposure illumination light emitted from the exposure light source 51 is, as an example, a wavelength of 450 [nm] or less. Further, as an example, the wavelength of the exposure illumination light may be 193 [nm]. The exposure light source 51 may be incorporated inside the exposure unit 50 or may be disposed outside the exposure unit 50. The exposure illumination light may be guided from the exposure light source 51 to the exposure unit 50 using a light guide member such as an optical fiber.

In the exposure apparatus 2, an operating state of the spatial light modulator 20 may be measured using the measuring device 1a prior to exposure to the exposed substrate 57 by the exposure unit 50. The operating state of the spatial light modulator may be measured, for example, by the measuring method of the third embodiment described above. Further, when the operating state of the spatial light modulator 20 is measured, the second detection unit 5a including the second control unit 25a calculates the desired designated position difference described above for each region of the disposition plane DP of the spatial light modulator 20.

That is, the second detection unit 5a including the second control unit 25a performs the above-described measurement a plurality of times while varying a value of the above-described designated position difference H1d. Then, on the basis of relationships between the plurality of measured and calculated position differences H1 and designated position difference H1d, a desired designated position difference, which is the designated position difference H1d for setting the desired position difference H1, is calculated for each region of the disposition plane DP of the spatial light modulator 20. Here, the desired position difference H1 refers to, for example, a position difference corresponding to a length of ¼ of the wavelength of the exposure illumination light that minimizes an intensity of the specularly reflected light DLa0 from the spatial light modulator 20 illustrated in FIG. 2.

A wavelength of the detection light in the second detection unit 5a may be a wavelength that is 1.5 times or more and 3.3 times or less the wavelength of the exposure illumination light of the exposure unit 50. That is, as described above, with respect to the spatial light modulator 20 used for exposure with the exposure illumination light (first wavelength $\lambda 1$), the detection optical system 10a of the second detection unit 5a may detect an image of the disposition plane DP using light of a second wavelength $\lambda 2$ which is 1.5 times or more and 3.3 times or less the wavelength of the exposure illumination light.

The desired designated position difference calculated for each region of the disposition plane DP of the spatial light modulator 20 is transmitted from the second control unit 25a of the second detection unit 5a to the exposure control unit 60 as an information signal S7. In exposure to the exposed substrate 57, the exposure control unit 60 sends the control signal S8 to the spatial light modulator 20 so that each spatial light modulation element 22 is disposed at the desired position difference H1 on the basis of the desired designated position difference for each region of the disposition plane DP transmitted from the second control unit 25a.

Further, when the spatial light modulator 20 is an angle modulation type spatial light modulator 20r (see FIG. 6), the second control unit 25a of the second detection unit 5a calculates a correspondence relationship between positional information as a rotation angle $\phi$ of the reflecting surface 22Rd from the disposition plane DP in each region of the disposition plane DP and an amount of light of an image in each region. The second control unit 25a transmits the correspondence relationship to the exposure control unit 60 as the information signal S7. In this case, the exposure control unit 60 sends the control signal S8 for controlling an angular position of each spatial light modulation element 22 of the spatial light modulator 20 on the basis of the correspondence relationship.

Effects of Exposure Apparatus of Fourth Embodiment (4) The exposure apparatus 2 of the fourth embodiment includes the exposure illumination optical system (52, 54) illuminating the spatial light modulator 20 having the plurality of spatial light modulation elements 22 having the reflecting surfaces 22R disposed on the disposition plane DP, the projection optical system 53 projecting light from the spatial light modulator 20 to the exposed substrate 57, the first detection unit 6 having the first detection optical system 30 and detecting light from the reflecting surfaces 22R, and the second detection unit 5a which is a detection unit having the second detection optical system 10 and detecting light from the reflecting surfaces 22R, and has a detection field of view larger than that of the first detection unit 6. Further, the position changing mechanism is provided for changing a positional relationship between the first detection unit 6, the second detection unit 5a, and the spatial light modulator 20 to either the first positional relationship in which the spatial light modulator 20 faces the first detection unit 6 and the second positional relationship in which the spatial light modulator 20 faces the second detection unit 5a.

With this configuration, during exposure to the exposed substrate 57 by the exposure unit 50 using the spatial light modulator 20, an operating state of the spatial light modulator 20 can be measured with high accuracy in a short period of time using the first detection unit 6 and the second detection unit 5a. Then, using the measurement results thereof, highly accurate exposure to the exposed substrate 57 can be performed by the exposure unit 50. Also, since a time required for measuring the spatial light modulator 20 is reduced, the exposure apparatus 2 with a high exposure processing capacity, that is, high productivity can be realized.

Modified Example of Exposure Apparatus

The exposure apparatus 2 (see FIG. 8) of the fourth embodiment described above has been configured to include the exposure unit 50 that performs exposure using the spatial light modulator 20, and the measuring device 1a of the second embodiment described above.

On the other hand, an exposure apparatus of a modified example includes the above-described measuring device 1 of the first embodiment instead of the measuring device 1a of the second embodiment. In this case, the position changing mechanism (or moving mechanism) 27 allows the spatial light modulator 20 to be movable between a position facing the exposure unit 50 and a position facing the measuring device 1.

Also in the exposure apparatus of the modified example, the same effects as those of the exposure apparatus of the fourth embodiment described above can be obtained.

Device Manufacturing Method of Fifth Embodiment

In a device manufacturing method of a fifth embodiment, devices such as semiconductor integrated circuits, printed circuit boards, and display devices are manufactured using the exposure apparatus 2 of the fourth embodiment or the exposure apparatus of the modified example described above.

Figure 9:
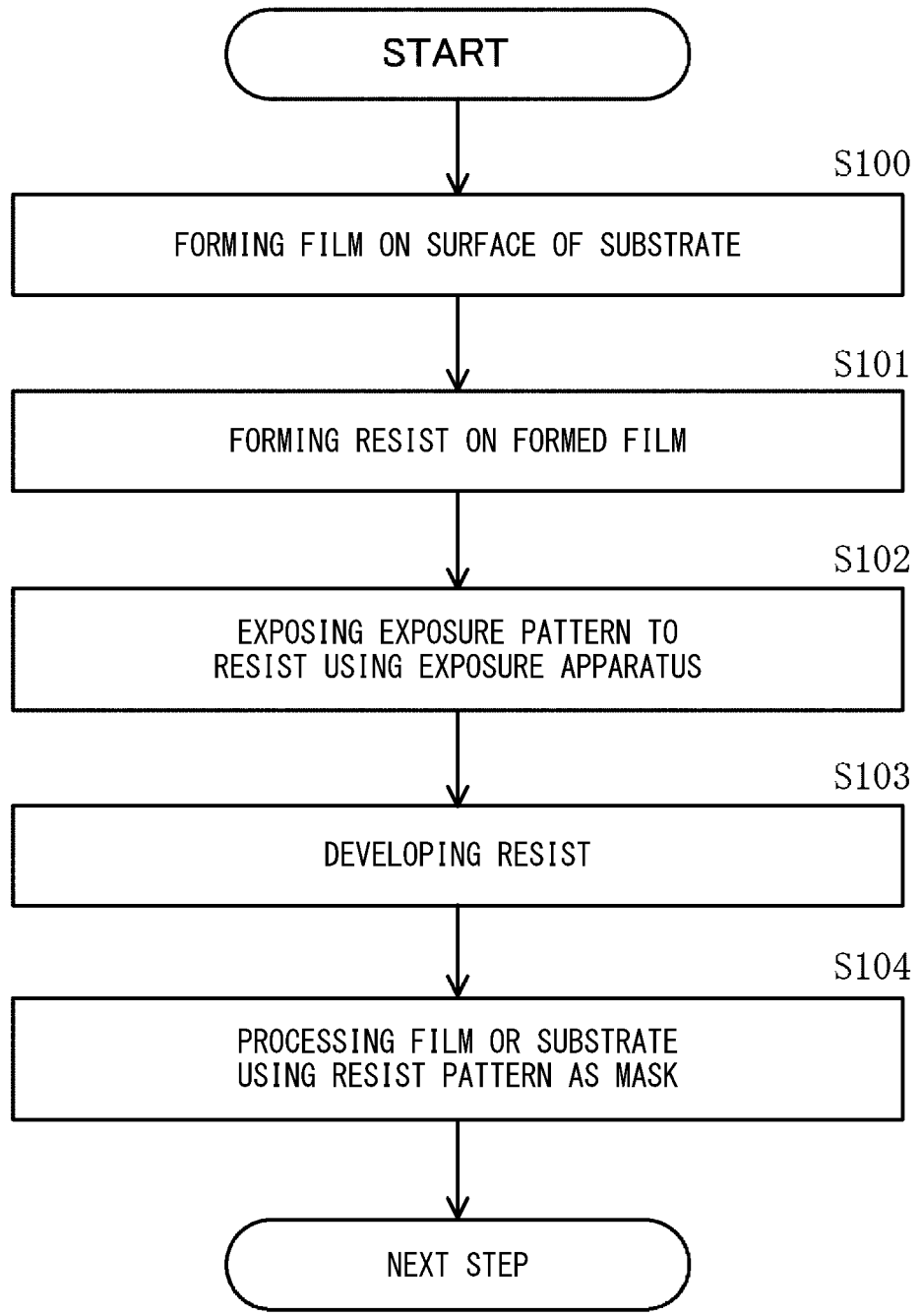
FIG. 9 is a diagram schematically showing a device manufacturing method according to a fifth embodiment.

FIG. 9 is a diagram schematically showing steps of the device manufacturing method of the fifth embodiment.

In step S100, a film made of a dielectric, a metal, or a semiconductor is formed on a surface of a substrate such as a semiconductor substrate, a ceramic substrate, or a glass substrate which is a device to be manufactured. Next, in step S101, a photoresist (resist) is formed on the film formed in step S100. The substrate with the resist formed on the surface is the exposed substrate 57 illustrated in FIG. 8.

Then, in step S102, the resist on the substrate (exposed substrate 57) is exposed to an exposure pattern as a light and dark pattern using the exposure apparatus 2 of the fourth embodiment or the exposure apparatus of the modified example described above. Then, in step S103, the resist on which the exposure pattern is exposed is developed to form a resist pattern. Thereafter, in step S104, a film formed on a substrate WF or a surface of the substrate WF is subjected to processing such as etching or ion implantation using the resist pattern as a mask.

Steps S103 and S104 are steps of forming a circuit pattern on the substrate on the basis of the exposure pattern formed on the resist.

Through steps S100 to S104 described above, a circuit pattern of one layer constituting a device is formed on the substrate WF.

Therefore, the processing proceeds to a next step after step S104 ends, and steps S100 to S104 are repeatedly performed to manufacture a device (a semiconductor integrated circuit, a printed circuit board, a display device, or the like) formed of a large number of layers.

Effect of Device Manufacturing Method of Fifth Embodiment

The device manufacturing method of the fifth embodiment includes forming a resist on a surface of the substrate (exposed substrate 57), forming an exposure pattern using the exposure apparatus 2 of the fourth embodiment or the exposure apparatus of the modified example, and forming a circuit pattern on the basis of the exposure pattern.

Thereby, since the substrate can be exposed by the exposure apparatus 2 or the like with high accuracy and high productivity, a high-performance device can be manufactured with high productivity.

The present invention is not limited to the above contents. Other aspects conceivable within the scope of the technical idea of the present invention are also included within the scope of the present invention. The present embodiment may combine all or part of the aspects described above.

DESCRIPTION OF THE REFERENCE SYMBOLS 1, 1a Measuring device
2 Exposure apparatus
5 Detection unit
6 First detection unit
5a Second detection unit
10 Detection optical system
10a Second detection optical system
14 Branching element
15 Objective lens
16 Detection aperture stop
18 Imaging unit
19 Imaging surface
20 Spatial light modulator
DP Disposition plane
22 Spatial light modulation element
22R Reflecting surface
25 Control unit (calculation unit)
25M Storage unit
25C Calculation unit
27 Position changing mechanism (moving mechanism)
30 First detection optical system
42 First control unit
50 Exposure unit
51 Exposure light source
55 Image-forming optical system
59 Stage
60 Exposure control unit

The invention claimed is:

1. An exposure apparatus comprising:
an illumination optical system illuminating a spatial light modulator which has a plurality of spatial light modulation elements each having a reflecting surface disposed on a disposition plane;
a projection optical system projecting light received from the spatial light modulator to a substrate;
a first detection unit including a first detection optical system and detecting light received from the reflecting surfaces;
a second detection unit including a second detection optical system and detecting light received from the reflecting surfaces, the second detection unit having a detection field of view that is larger than a detection field of view of the first detection unit; and
a position changing mechanism changing a positional relationship among the first detection unit, the second detection unit, and the spatial light modulator to one of (i) a first positional relationship in which the spatial light modulator faces the first detection unit and (ii) a second positional relationship in which the spatial light modulator faces the second detection unit.

2. The exposure apparatus according to claim 1, wherein the position changing mechanism sets the positional relationship to one of (i) the first positional relationship, (ii) the second positional relationship, and (iii) a third positional relationship in which the spatial light modulator faces the projection optical system.

3. The exposure apparatus according to claim 2, wherein the first detection unit detects an image on the disposition plane, and
the second detection unit detects an image on the disposition plane.

4. The exposure apparatus according to claim 3, wherein the second detection unit includes a calculation unit calculating positional information of the reflecting surfaces in a normal direction of the disposition plane or positional information on a rotation angle of the reflecting surfaces from the disposition plane based on an amount of detection light which is an amount of light of the detected image.

5. The exposure apparatus according to claim 4, wherein the calculation unit of the second detection unit calculates the positional information based on a detection result of the first detection unit and the amount of detection light which is an amount of light of the image detected by the second detection unit.

6. The exposure apparatus according to claim 3, wherein the illumination optical system illuminates the spatial light modulator with light of a first wavelength $\lambda 1$, and
the first detection unit detects the image using light of a second wavelength $\lambda 2$ which is 1.5 times or more and 3.3 times or less than the first wavelength $\lambda 1$.

7. The exposure apparatus according to claim 1, wherein a numerical aperture of the first detection optical system on the spatial light modulator side is larger than a numerical aperture of the second detection optical system on the spatial light modulator side.

8. The exposure apparatus according to claim 1,
wherein the first detection unit includes a position measurement unit which measures positional information of the reflecting surfaces in a normal direction of the disposition plane.

9. The exposure apparatus according to claim 8,
wherein the position measurement unit includes an interference microscope unit which causes light reflected by the reflecting surfaces to interfere with reference light.

10. The exposure apparatus according to claim 1,
wherein a numerical aperture NA of the second detection optical system on the spatial light modulator side satisfies $\lambda 2/(5 \times P) < NA < \sqrt{2} \times \lambda 2/(2 \times P)$ provided that a disposition period of the plurality of spatial light modulation elements is P, and a wavelength of light detected by the second detection unit is $\lambda 2$.

11. The exposure apparatus according to claim 1,
wherein a product of an outer diameter D [mm] of a detection field of view of the second detection optical system on the spatial light modulator side and a numerical aperture NA of the second detection optical system on the spatial light modulator side is 0.5 or more.

12. A device manufacturing method comprising:
forming a resist on a surface of a substrate;
exposing an exposure pattern on the substrate using the exposure apparatus according to claim 1; and
forming a circuit pattern on the substrate based on the exposure pattern.

13. A measuring device comprising:
an illumination system irradiating light on a disposition plane on which each reflecting surface of a plurality of spatial light modulation elements included in a spatial light modulator is disposed;
a detection optical system forming an image on the disposition plane based on light from the plurality of reflecting surfaces;
an imaging unit detecting an image on the disposition plane formed by the detection optical system; and
a calculation unit calculating, based on an image signal indicating an amount of detection light which is an amount of light of the image detected by the imaging unit, (i) positional information of the reflecting surfaces of the plurality of spatial light modulation elements in a normal direction of the disposition plane or (ii) positional information on a rotation angle of the reflecting surfaces of the plurality of spatial light modulation elements from the disposition plane, wherein
the imaging unit includes a plurality of pixels including a first pixel, and detects, by the first pixel, light from an image formed by a plurality of first spatial light modulation elements with reflecting surfaces that are amongst the plurality of spatial light modulation elements of the spatial light modulator, and
the calculation unit calculates positional information of the plurality of first spatial light modulation elements, based on the image signal indicating the amount of light detected by the first pixel, and the positional information of the plurality of first spatial light modulation elements is positional information of the reflecting surfaces of the plurality of first spatial light modulation elements in the normal direction of the disposition plane, or positional information of the rotation angle of the reflecting surfaces of the plurality of first spatial light modulation elements from the disposition plane.

14. The measuring device according to claim 13, wherein
the calculation unit calculates the positional information in response to sending a control signal to the plurality of spatial light modulation elements, and
the calculation unit calculates the positional information based on the image signal by referring to a predetermined relationship between (a) the amount of detection light and (b) the positional information of the reflecting surfaces of the plurality of spatial light modulation elements in the normal direction of the disposition plane, or the positional information of the rotation angle of the reflecting surfaces of the plurality of spatial light modulation elements from the disposition plane.

15. A measuring device comprising:
a first detection unit detecting light received from reflecting surfaces of a spatial light modulator which has a plurality of spatial light modulation elements each having one of the reflecting surfaces disposed on a disposition plane;
a second detection unit detecting light received from the reflecting surfaces and having a detection field of view that is larger than a detection field of view of the first detection unit; and
a position changing mechanism changing a positional relationship among the first detection unit, the second detection unit, and the spatial light modulator to one of (i) a first positional relationship in which the spatial light modulator faces the first detection unit and (ii) a second positional relationship in which the spatial light modulator faces the second detection unit.

16. An exposure method comprising:
illuminating a spatial light modulator which has a plurality of spatial light modulation elements each having a reflecting surface disposed on a disposition plane;
projecting light from the spatial light modulator to a substrate;
detecting light from the reflecting surfaces using a first detection unit;
detecting light from the reflecting surfaces using a second detection unit which has a detection field of view that is larger than a detection field of view of the first detection unit;
changing a positional relationship among the first detection unit, the second detection unit, and the spatial light modulator to a first positional relationship in which the spatial light modulator faces the first detection unit; and
changing the positional relationship to a second positional relationship in which the spatial light modulator faces the second detection unit.

17. A device manufacturing method comprising:
forming a resist on a surface of a substrate;
exposing an exposure pattern on the substrate using the exposure method according to claim 16; and
forming a circuit pattern on the substrate based on the exposure pattern.

* * * * *